(12) United States Patent
Barber

(10) Patent No.: US 6,230,031 B1
(45) Date of Patent: May 8, 2001

(54) POWER AMPLIFYING CIRCUITRY FOR WIRELESS RADIO TRANSCEIVERS

(75) Inventor: Clifton J. Barber, Forest Park, GA (US)

(73) Assignee: Oki Telecom, Inc., Suwanee, GA (US)

( * ) Notice: Subject to any disclaimer, the term of this patent is extended or adjusted under 35 U.S.C. 154(b) by 0 days.

(21) Appl. No.: 09/251,756

(22) Filed: Feb. 18, 1999

Related U.S. Application Data

(63) Continuation-in-part of application No. 08/829,246, filed on Mar. 31, 1997, now abandoned.
(60) Provisional application No. 60/075,337, filed on Feb. 20, 1998.

(51) Int. Cl.$^7$ ............................. H04B 1/00; H01Q 11/12
(52) U.S. Cl. ............................................ 455/571; 455/127
(58) Field of Search ...................... 455/99, 557, 571, 455/553, 126, 127, 90, 69, 88, 551

(56) References Cited

U.S. PATENT DOCUMENTS

| | | | |
|---|---|---|---|
| 2,678,998 | 5/1954 | Young, Jr. ................................. | 250/6 |
| 3,065,424 | 11/1962 | Whisenhunt .......................... | 325/319 |
| 4,307,455 | 12/1981 | Juhasz et al. ......................... | 364/900 |
| 4,414,623 | 11/1983 | Davis et al. ........................... | 364/200 |
| 4,455,623 | 6/1984 | Wesemeyer et al. ................. | 364/900 |
| 4,510,460 | 4/1985 | Tamura ................................. | 330/285 |
| 4,523,155 | 6/1985 | Walczak et al. ...................... | 330/279 |
| 4,602,218 | 7/1986 | Vilmur et al. ......................... | 330/279 |
| 4,636,741 | 1/1987 | Mitzaff ................................. | 330/127 |
| 4,654,882 | * 3/1987 | Ikeda ..................................... | 455/88 |
| 4,850,006 | 7/1989 | Sasaki et al. .......................... | 379/58 |
| 4,870,698 | 9/1989 | Katsuyama et al. .................. | 455/67 |
| 4,928,307 | 5/1990 | Lynn ..................................... | 379/395 |
| 4,947,455 | 8/1990 | Swanson ............................... | 455/115 |
| 5,036,532 | 7/1991 | Metroka et al. ....................... | 379/58 |
| 5,048,117 | * 9/1991 | Aisaka et al. ......................... | 455/571 |
| 5,107,487 | 4/1992 | Vilmur et al. ......................... | 370/18 |
| 5,109,541 | 4/1992 | Park ...................................... | 455/89 |
| 5,121,504 | * 6/1992 | Toko ..................................... | 455/90 |
| 5,144,258 | 9/1992 | Nakanishi et al. .................... | 330/129 |
| 5,146,614 | 9/1992 | Furuno .................................. | 455/89 |
| 5,164,680 | 11/1992 | Mahabadi ............................. | 330/264 |
| 5,175,871 | * 12/1992 | Kunkel ................................. | 455/69 |
| 5,193,219 | 3/1993 | Tamura ................................. | 455/89 |
| 5,214,505 | 5/1993 | Rabowsky et al. .................... | 358/86 |
| 5,239,690 | 8/1993 | Heinonen ............................. | 455/89 |
| 5,276,918 | 1/1994 | Cornforth et al. .................... | 455/89 |
| 5,303,395 | * 4/1994 | Dayani ................................. | 455/571 |

(List continued on next page.)

FOREIGN PATENT DOCUMENTS 60-117958   6/1985   (JP) .

Primary Examiner—Vivian Chang
Assistant Examiner—Charles N. Appiah
(74) Attorney, Agent, or Firm—Thomas, Kayden, Horstemeyer & Risley, LLP

(57) ABSTRACT

A system for amplifying output transmitted power of a mobile battery powered radio transceiver includes a secondary voltage source, multiple power amplifiers, a central processing unit to control the amplification of the output transmitted signal, and a switch to detect the presence of the radio transceiver. The system includes a method for compensating for the signal loses associated with cabling used in the installation of the amplifying circuitry in an automobile application. According to the first preferred embodiment of the present invention, the method for compensating for signal losses is a manually configured bank of switches. When the amplifying circuitry is installed in the automobile application, the bank of switches is set to specify the amount of loss compensation needed. Multiple amplifiers are used for amplification of the output transmitted signal when the radio transceiver is operating at different frequencies. Gain of the amplifying circuitry remains fixed and the central processing unit will control the output of the portable transceiver, therefore changing the input level into the amplifying circuitry and hence the output level of the amplifying circuitry.

7 Claims, 23 Drawing Sheets

U.S. PATENT DOCUMENTS

| | | | |
|---|---|---|---|
| 5,369,803 | 11/1994 | Hirsawa et al. | 455/89 |
| 5,442,322 | 8/1995 | Kornfeld et al. | 330/285 |
| 5,442,618 * | 8/1995 | Dewey et al. | 369/124 |
| 5,450,620 | 9/1995 | Vaisanen | 455/127 |
| 5,457,814 * | 10/1995 | Myrskog et al. | 455/571 |
| 5,467,055 | 11/1995 | Wray et al. | 330/129 |
| 5,481,226 | 1/1996 | Parkes, Jr. | 330/279 |
| 5,511,234 | 4/1996 | Ha | 455/127 |
| 5,524,044 | 6/1996 | Takeda | 379/58 |
| 5,551,067 * | 8/1996 | Hulkko et al. | 455/88 |
| 5,752,171 | 5/1998 | Akiya | 455/126 |
| 5,754,962 * | 5/1998 | Griffin | 455/569 |
| 5,802,167 * | 9/1998 | Hong | 379/388 |
| 5,812,097 * | 9/1998 | Maldonado | 343/790 |
| 5,898,908 * | 4/1999 | Griffin et al. | 455/127 |
| 5,937,336 | 8/1999 | Kumagai | 455/126 |
| 5,995,813 * | 11/1999 | Ishikura et al. | 455/127 |
| 6,032,054 * | 2/2000 | Schwinke | 455/557 |

\* cited by examiner

POWER AMPLIFYING CIRCUITRY FOR WIRELESS RADIO TRANSCEIVERS

CROSS-REFERENCES TO RELATED APPLICATIONS

This application claims the benefit of U.S. Provisional Application No. 60/075,337, filed Feb. 20, 1998, which is incorporated herein by reference in its entirety, and this application is a continuation-in-part of U.S. Ser. No. 08/829,246, filed Mar. 31, 1997 abandon, which is also incorporated herein by reference in its entirety.

BACKGROUND OF THE INVENTION

The present invention relates generally to the field of wireless radio transceivers, and more specifically, to the field of providing a multi-leveled power amplifier circuit for use in battery powered wireless radio transceivers. Such wireless radio transceivers are used in wireless telephone systems such as code division multiple access (CDMA), time division multiple access (TDMA), and advanced mobile phone services (AMPS) with the systems operating at multiple frequency ranges.

In battery powered radio transceivers, the maximum transmitted power is typically limited by the magnitude of the battery voltage. An additional concern with battery powered radio transceivers is the need to minimize battery energy drain, or the current drained from the battery, thereby maximizing battery life. Therefore, there is a trade-off between maximizing transmitted power to maximize usable range and minimizing battery energy drain to maximize battery life. This problem is compounded when the radio transceiver is used in an automotive application, where said radios are typically used in the outer fringes of the coverage area of base stations. Power amplifying circuitry has been proposed that uses a secondary battery, such as an automobile battery, to provide the energy source to increase the maximum transmitted power.

Previously proposed power amplifying circuits have typically dealt with radio transceivers operating in older AMPS systems, which operate in a single frequency range around 800 megahertz (MHz). However, with the newly adopted digital wireless cellular telephone standards TDMA and CDMA, cellular telephones are able to operate at multiple different frequency ranges, an example being the operation of CDMA systems at frequency ranges of 800 megahertz (MHz) or 1.9 Gigahertz (GHz). The resulting dual mode battery powered radio transceivers which support these standards must also operate at different frequency ranges, hence the power amplifying circuitry must also support multiple operating frequency ranges.

There is, therefore, a need in the industry for a system addressing these problems, as well as other related and unrelated problems.

BRIEF SUMMARY OF THE INVENTION

A power amplifying system for amplifying the output transmitted power of a mobile, battery powered, radio transceiver includes a secondary voltage source and amplying circuitry including multiple power amplifiers, a central processing unit to control the amplification of the output transmitted signal, and a mechanism for detecting the presence of the radio transceiver. The system preferably performs a method for compensating for the signal losses associated with cabling used in the installation of the amplifying circuitry in an automobile application. According to the first preferred embodiment of the present invention, the method for compensating for signal losses utilizes a manually configured bank of switches. When the amplifying circuitry is installed in the automobile application, the bank of switches is set to specify the amount of loss compensation needed.

According to the first preferred embodiment of the present invention, the multiple amplifiers are used for amplification of the output transmitted signal when the radio transceiver is operating at different frequency ranges or modes. According to the first preferred embodiment of the present invention, the gain of the amplifying circuitry remains fixed during a particular mode. A central processing unit in the radio transceiver communicates with the central processing unit of the amplifying circuitry to identify the mode used by the radio transceiver, thereby effecting the output level of the amplifying circuitry. According to a second preferred embodiment of the present invention, the manually configured set of switches is replaced by an automatic test method. Said test method is applied at system power up to measure the amount of signal loss present in the system.

Objects, features, and advantages of the present invention will become apparent upon reading and understanding the present specification, when taken in conjunction with accompanying drawings.

DETAILED DESCRIPTION OF THE INVENTION

Figure 1:
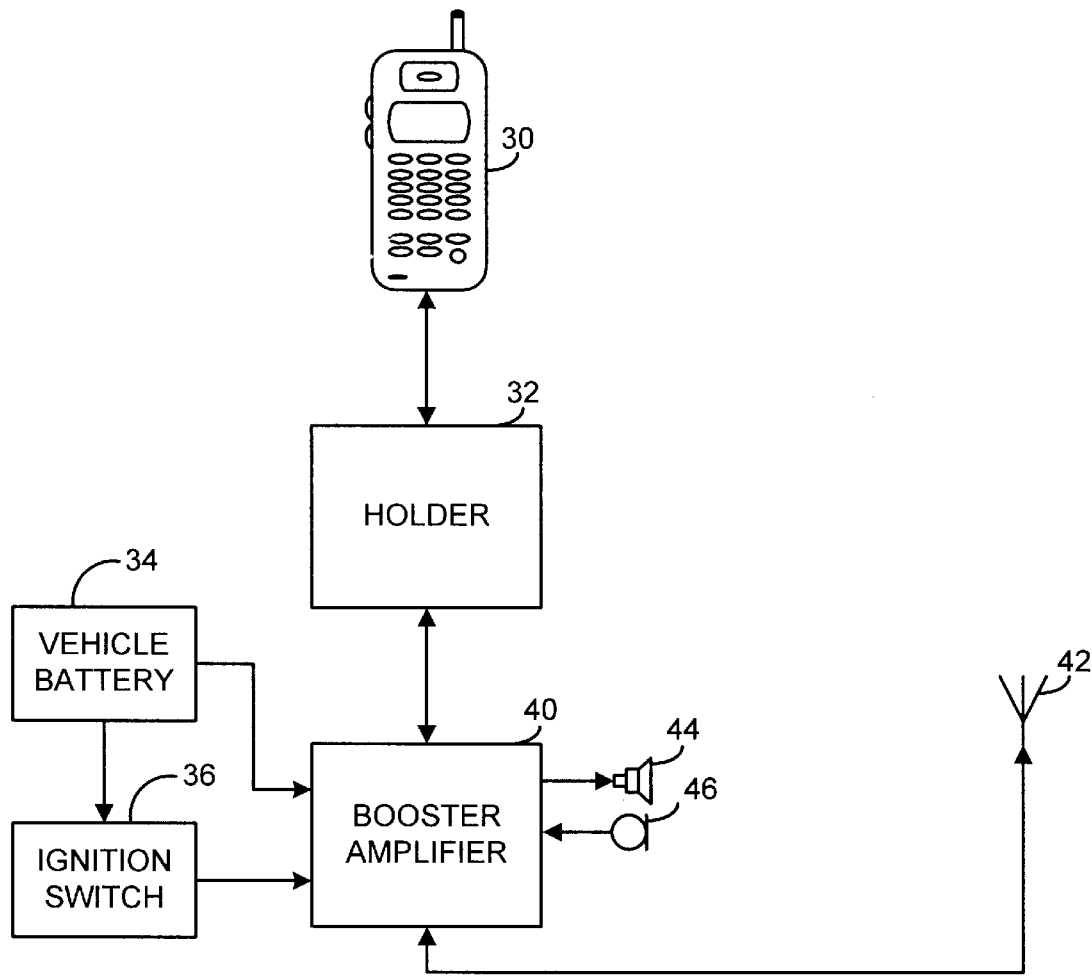
FIG. 1 is a block diagram representation of one embodiment of an automobile application including a radio transceiver, a holder, accessories, and a booster amplifier.

Referring now in greater detail to the drawings, FIG. 1 shows a block diagram representation of the first embodiment of an automobile application including a radio transceiver 30, a holder 32, accessories 44 and 46, and a booster amplifier 40. The battery operated radio transceiver (or wireless telephone) 30 locks into place in the holder 32, which is connected to the booster amplifier 40, which provides a central place for connecting accessories 44 and 46. In accordance with this embodiment, the holder 32 simply passes signals between the radio transceiver 30 and the booster amplifier 40, but other embodiments include intelligent holders which translate signals and provide other functions. The booster amplifier 40 receives power from a vehicle battery 34, in accordance with conventional operation of a conventional ignition switch 36, and hence draws no energy from the battery located in the radio transceiver 30.

The booster amplifier 40 connects to an additional antenna 42 which is in addition to an antenna that is in the radio transceiver 30. The connections between the radio transceiver 30, the holder 32, and the booster amplifier 40 include, at least, signaling connections and a coaxial cable for passing RF signals to and from the radio transceiver 30. The accessories 44 and 46 simplify usage of the radio transceiver 30 when it is in the holder 32. These devices include an external speaker 44 and an external microphone 46, permitting the user to use the radio transceiver 30 in 'hands free mode'.

Figure 2:
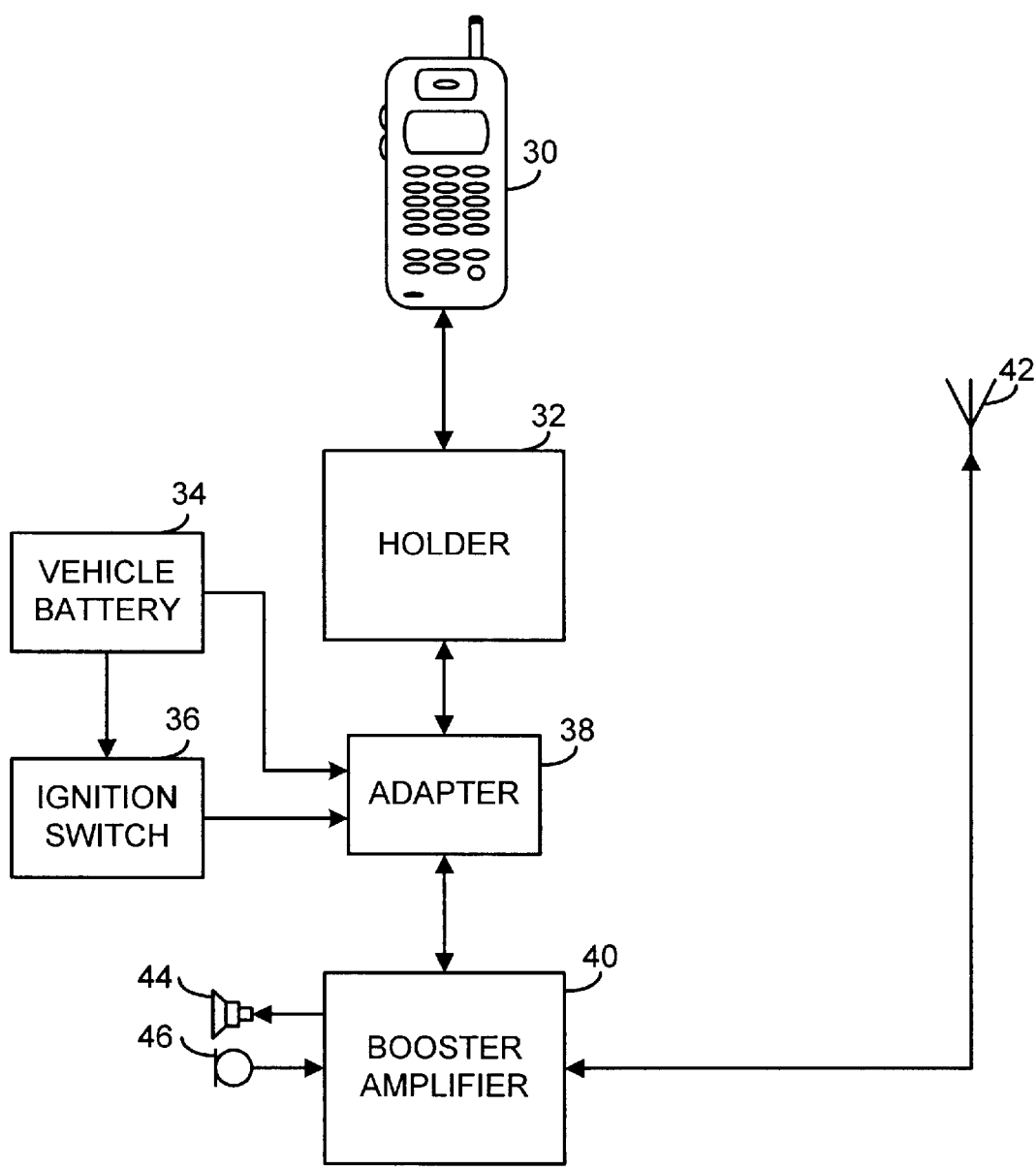
FIG. 2 is a block diagram representation of another embodiment of an automobile application including a radio transceiver, a holder, accessories, an adapter, and a booster amplifier.

Refer now to FIG. 2 for a block diagram representation of another preferred embodiment of an automobile application including a radio transceiver 30, a holder 32, an adapter 38, and a booster amplifier 40, to which is connected the accessories 44 and 46. The holder 32 connects to the adapter 38, which permits the holder 32 to be attached to a booster amplifier 40. The adapter 38 permits for the design of a single booster amplifier 40 to work with multiple different holders.

Figure 3:
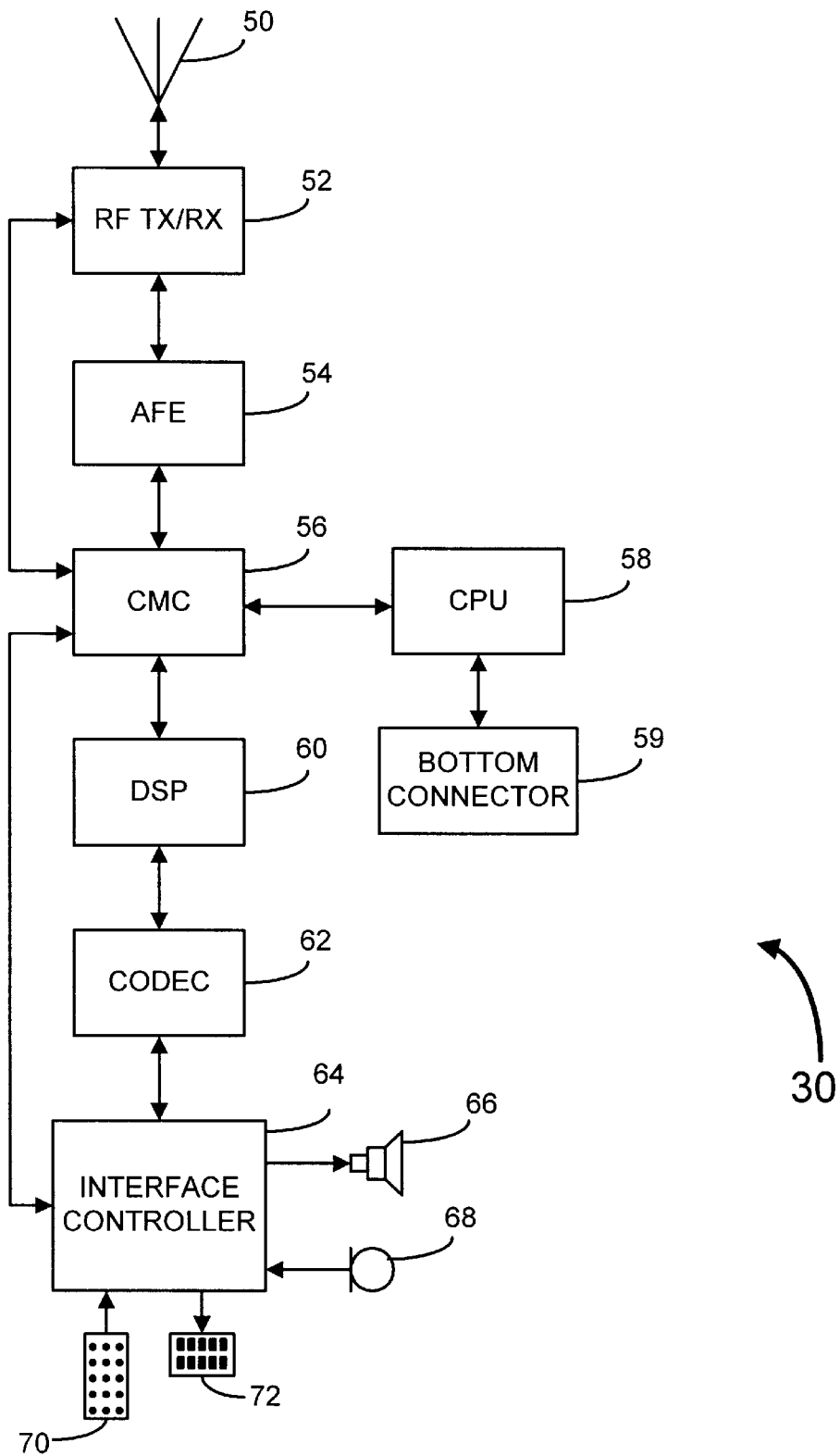
FIG. 3 is a block diagram representation of a wireless telephone.

Refer now to FIG. 3 for a block diagram representation of a code division multiple access (CDMA) radio transceiver 30 (FIG. 2) in accordance with one preferred embodiment of the present invention. This particular radio transceiver 30 (FIG. 2) is multi-mode and operates in both CDMA (digital) and AMPS (analog) modes. Radio transceivers operating in TDMA and single mode transceivers may be represented by relatively similar diagrams. The diagram additionally applies to a variety of wireless telephones of alternate embodiments of the present invention, including dual mode cellular and PCS telephones. According to one preferred embodiment of the present invention, radio signals are received through an antenna 50 and then filtered, mixed to lower frequencies, automatic gain controlled, and in a CDMA mode, I and Q demodulated (separating the combined received signal into its in-phase (I) and quadrature-phase (Q) components) in a radio frequency transmit/receive (RF TX/RX) circuit 52 before being converted, in an analog front end (AFE) 54, from analog to digital and supplied to a CDMA modem circuit (CMC) 56. As controlled by a central processing unit (CPU) 58, the CMC 56 demodulates the I and Q signals into an interleaved signal stream which, according to one preferred embodiment of the present invention, is de-interleaved, Viterbi decoded and digitally speech decoded by a digital signal processor (DSP) 60 before being decoded by a coder/decoder (CODEC) 62 into an audio signal which is controllably amplified by an interface controller 64 and output through a transceiver speaker 66. Likewise, a reverse path is followed through the radio transceiver 30 as a transceiver microphone 68 detects user speech. A keypad 70 and a display 72 provide conventional user input and output.

According to one preferred embodiment, through a bottom (external) connector 59, the CPU 58 outputs signals which travel through the holder 32 (not shown) to the booster amplifier 40 (not shown) as indications of which mode the radio transceiver 30 is transmitting (CDMA or AMPS), and according to this one preferred embodiment, of which frequency band is in use. The booster amplifier 40 then uses this information for selecting the appropriate frequency compliant circuitry, and the amount of linear amplification applied to the audio signal as is further discussed in the following parts of this detailed specification. As discussed above, although not shown in FIG. 3, an RF signal also passes from the RF TX/RX 52, through the holder 32, to the booster amplifier 40.

Figure 4:
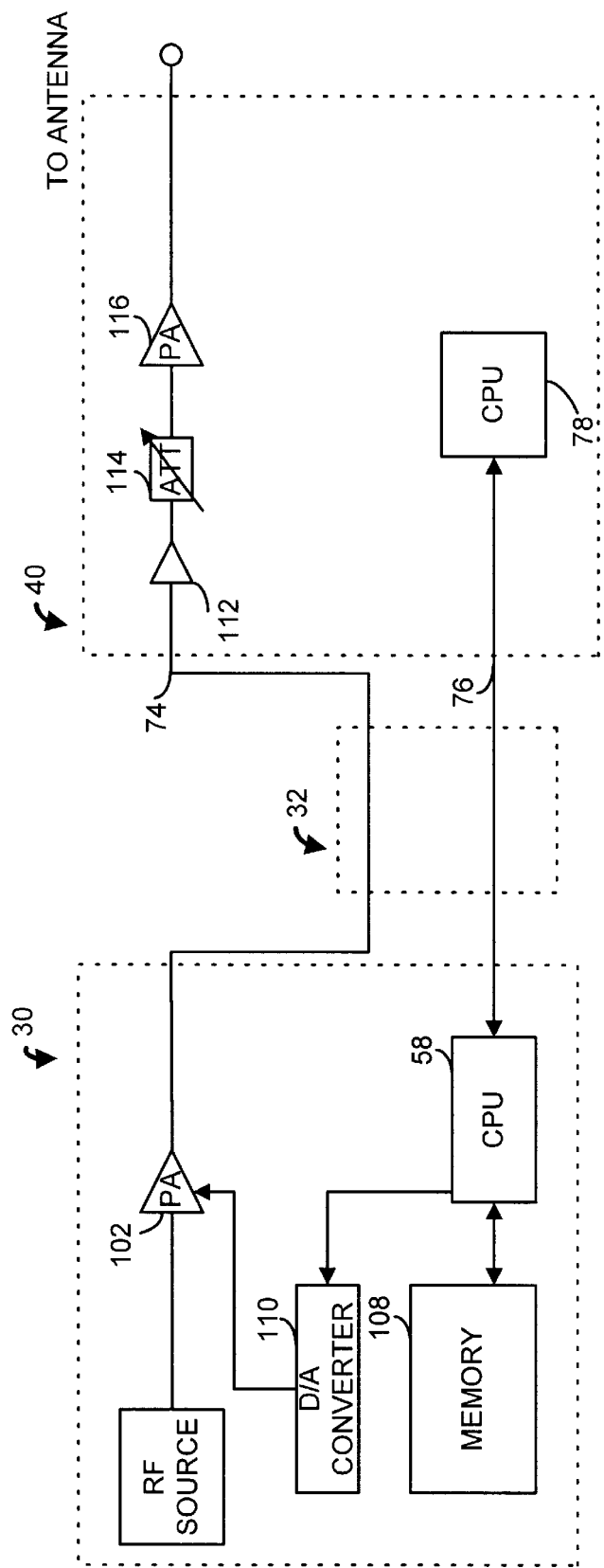
FIG. 4 is a block diagram representation of selected transmit portions of an automotive application of the amplifying circuitry, in accordance with one preferred embodiment of the present invention

Refer now to FIG. 4 for a block diagram representation of selected transmit portions of an automotive application of the amplifying circuitry, in accordance with one preferred embodiment of the present invention. The automotive application consists of three major components: the radio transceiver 30 (FIG. 1), the booster amplifier 40 (FIG. 1), and the holder 32 (FIG. 1). Providing electrical connections between the radio transceiver 30 (FIG. 1) and the booster amplifier 40 (FIG. 1) are two cables. A first connection is a RF coaxial cable 74 providing a medium for transmission of the communications signal from the radio transceiver 30 (FIG. 1) to the booster amplifier 40 (FIG. 1). The RF coaxial cable 74 has associated a signal loss, referred to as the cable loss. The cable loss models the attenuation of the communications signal due to the RF coaxial cable used to connect the radio transceiver 30 (FIG. 1) to the booster amplifier 40 (FIG. 1). A second connection is a signalling connection 76 providing a medium for transmission of control signals between the CPU 58 (FIG. 3) in the radio transceiver 30 (FIG. 1) and a CPU 78 in the booster amplifier 40 (FIG. 1).

The transmit power control portion of the radio transceiver 30 (FIG. 1) can be modeled to contain a variable power amplifier (PA) 102 amplifying signals from an RF source 98, as controlled by the CPU 58 through a digital to analog (D/A) converter 110. The power amplifier (PA) 102 provides the majority of the amplification of the internal signal, i.e., to make it ready for transmission. The CPU 58 (FIG. 3) accesses a memory 108 to store and retrieve data concerning the operation of the radio transceiver 30 (FIG. 1). In other embodiments, a variety of different amplification arrangements are utilized inside the radio transmitter 30.

The CPU 58, knowing the operating mode of the wireless radio transceiver 30, transmits the operating mode of the wireless radio transceiver 30 to the CPU 78 located in the booster amplifier 40. Based on the operating mode of the radio transceiver 30 sent from the CPU 58, the CPU 78 sets the operating mode of the booster amplifier 40. If the wireless radio transceiver 30 is operating in analog mode, 800 megahertz, the CPU 78 enables the booster amplifier 40 to operate in power amplification compensation mode, as further discussed below. If the wireless radio transceiver 30 is operating in digital mode, either 800 MHz or 1.9 GHz, the CPU 78 does not enable the booster amplifier 40 to operate in power amplification compensation mode. A buffer 112 is shown connected to an attenuator 114, which is shown connected to a power amplifier 116, each of which represent multiple components and connection, including connections to the CPU 78, not shown in FIG. 4, as discussed below.

In one preferred embodiment, during analog (AMPS) mode, radio signals are output from the radio transceiver 30 at one of a first set of 30 conventional power levels. This set of power levels conventionally consists of 6 power levels ranging in values of 0 watts to 0.6 watts. Amplification by the booster amplifier 40 (FIG. 1) of the signals from the radio transceiver 30 (FIG. 1) by the PA 116 defines a second set of power levels created by an 8 dB linear gain, or a two level gain. The power levels 1 through 6 in the radio transceiver 30 (FIG. 1) become power levels 3 through 8 in the booster amplifier 40 (FIG. 1) when amplification is introduced. Levels 1 and 2 in the radio transceiver 30 (FIG. 1) also remain available from the booster amplifier 40 (FIG. 1) when the 8 dB linear gain is not introduced.

Figure 5:
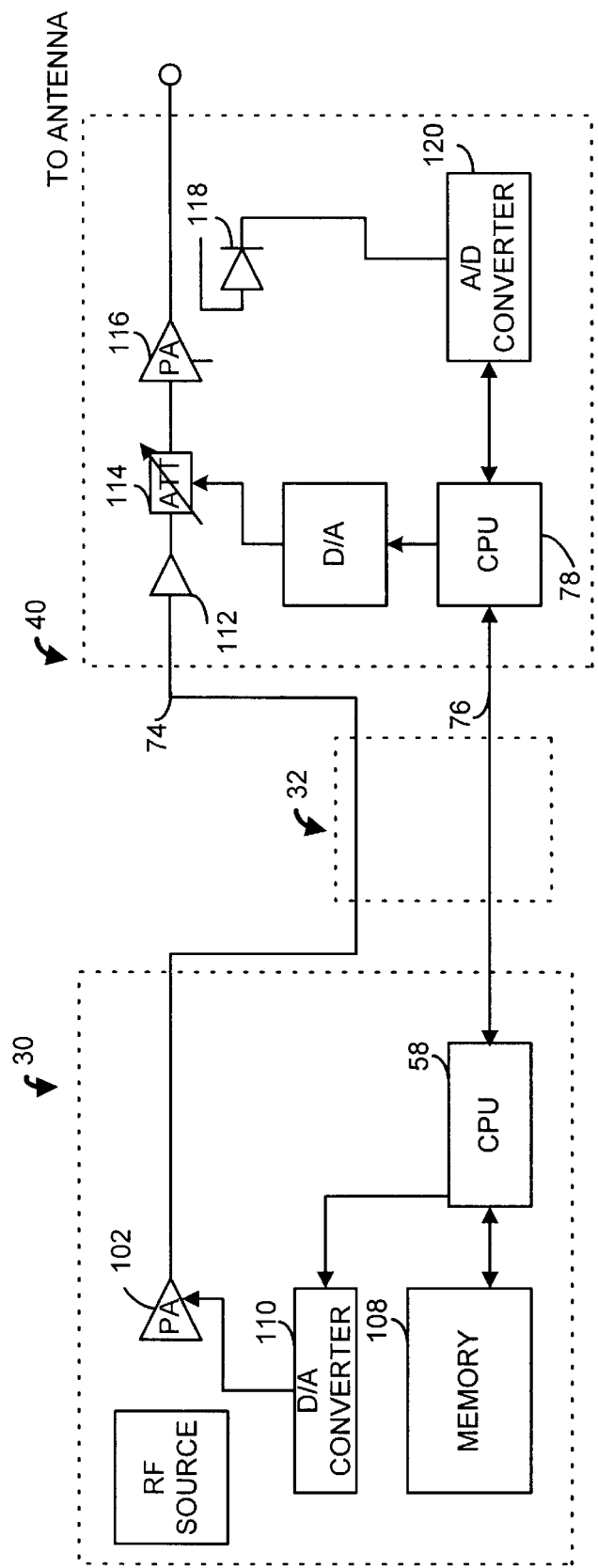
FIG. 5 is a block diagram representation of selected transmit portions of an automotive application of the amplifying circuitry, in accordance with another preferred embodiment of the present invention.

Now refer to FIG. 5 for a block diagram representation of selected transmit portions of an automotive application of the amplifying circuitry, in accordance with another preferred embodiment of the present invention. In this embodiment, an active power compensation system is provided through the use of a multitude of diodes in the booster amplifier 40. A diode 118 couples the transmitted signal and generates the transmitted signal strength indicator (TSSI) of the transmitted signal. The TSSI is converted via an A/D converter 120. The digital TSSI is communicated to the CPU 78, which communicates to the CPU 58 in the radio transceiver 30 via the signalling connection 76 to provide information for controlling the amount of attenuation provided by the variable attenuator 114. The CPU 78 provides control to the variable attenuator via the D/A converter as shown.

In one preferred embodiment, the CPU 78 located in the booster amplifier 40 and a set of switches (discussed below), which are used for indicating signal strength loss due to the cable used, are located within the booster amplifier 40. This allows for the amplification of the RF signal, as well as compensation for signal loss due to length of the RF coaxial cable 74 (FIG. 4), to be performed by the booster amplifier 40 (FIG. 1).

Figure 6:
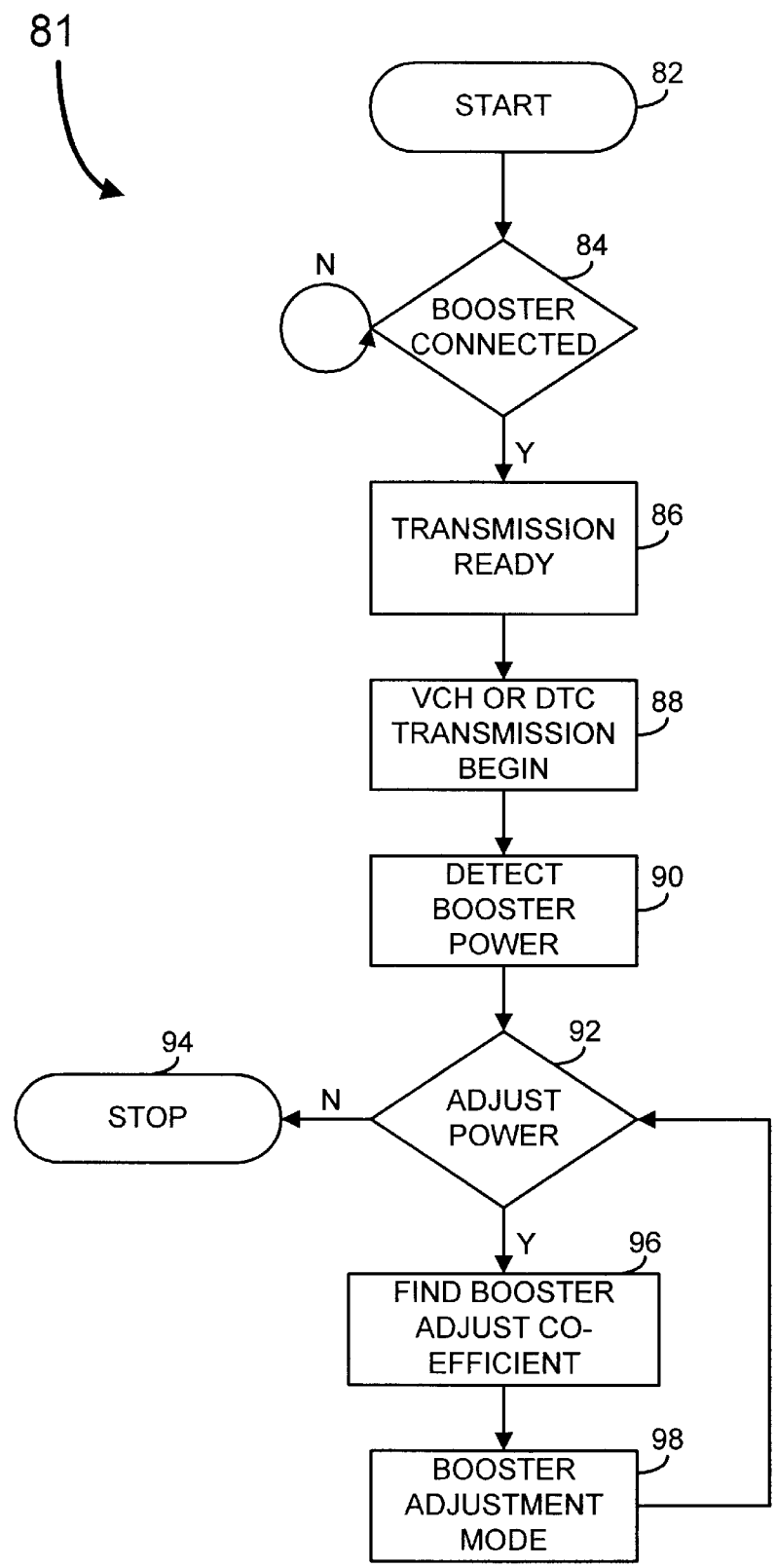
FIG. 6 is a flow diagram showing the general flow for the automatic calibration algorithm for the amplifying circuitry.

Refer now to FIG. 6 for a flow chart of an automatic calibration algorithm 81 for the booster amplifier 40 (FIG. 1) executing in the CPU 58 (FIG. 3) in the radio transceiver 30 (FIG. 1). When a transmit operation is initiated, the CPU 58 (FIG. 3) begins at start step 82. The CPU 58 (FIG. 3) first checks for the presence of the booster amplifier 40 (FIG. 1) in step 84. If the booster amplifier 40 (FIG. 1) is not present, the CPU 58 (FIG. 3) will continue to check for the presence of the booster amplifier 40 (FIG. 1) in step 84. If the booster amplifier 40 (FIG. 1) is present, the CPU 58 (FIG. 3) moves to the transmission ready step 86 and begins either analog voice channel (Vch) or digital traffic channel (DTC) transmission in step 88, depending on the operating mode of the radio transceiver 30 (FIG. 1). The CPU 58 (FIG. 3) detects the power generated by the booster 40 (FIG. 1) in step 90. After detecting the power of the booster 40 (FIG. 1), the CPU 58 (FIG. 3) determines if the booster power needs to be adjusted in step 92, i.e., the CPU 58 (FIG. 3) measures the booster power against some predetermined threshold. If the power of the booster 40 (FIG. 1) does not need to be adjusted, i.e., the booster power is within pre-specified limits, the CPU 58 (FIG. 3) stops in step 94. If the power of the booster 40 (FIG. 1) needs to be adjusted, the CPU 58 (FIG. 3) determines the booster adjust coefficient in step 96 and then enters into booster power adjustment mode 98. In block 96, the CPU 58 (FIG. 3) determines the booster compensation coefficient and the compensation index. The booster compensation coefficient is expressible as the following equation:

coefficient=80(h)−Booster_Power_Out(h)

{(h) denotes value in hexadecimal}

The compensation index is derived from the following table:

| Comp Index | | 0[000] | 1[001] | 2[010] | 3[011] | 4[100] | 5[101] |
|---|---|---|---|---|---|---|---|
| Comp Coeff Data: | PL3 | 0 | 10 | 20 | −5 | −8 | −16 |
| | PL4 | 0 | 8 | 16 | −3 | −5 | −9 |
| | PL5 | 0 | 4 | 5 | −2 | −4 | −6 |
| | PL6 | 0 | 3 | 4 | −2 | −3 | −5 |
| | PL7 | 0 | 2 | 3 | −1 | −2 | −3 |
| Error Value | | 0 < X < 14 | 14 < X < 26 | X > 26 | −9 < X < 0 | −19 < X < −9 | X < −19 |
| Power Dev (dB) | | −1.0~0 | −2.0~−1.0 | ~−2.0 | 0~0.6 | 0.6~1.2 | 1.2~ |
| Comp Value (dB) | | 0 | 1.0 | 2.0 | −0.6 | −1.2 | −1.8 |

Once the CPU 58 (FIG. 3) enters into booster adjustment mode (step 98), it will remain in that mode until it confirms that the booster power output is within prescribed limits. Once the proper booster power level is confirmed, the CPU 58 (FIG. 3) returns to decision block 92 The CPU 58 (FIG. 3) restarts at step 82 when the next transmit operation is initiated.

The mode that the radio transceiver 30 (FIG. 1) is operating in also determines the amount of power amplification compensation needed. CDMA radio transceivers 30 (FIG. 1) by virtue of CDMA technology, have a 16 dB process gain that makes the need for power amplification compensation unnecessary, therefore, if the radio transceiver 30 (FIG. 1) is operating in CDMA mode, no power amplification compensation is needed. However, if the radio is operating in AMPS or TDMA mode, power amplification compensation would be needed.

Figure 7:
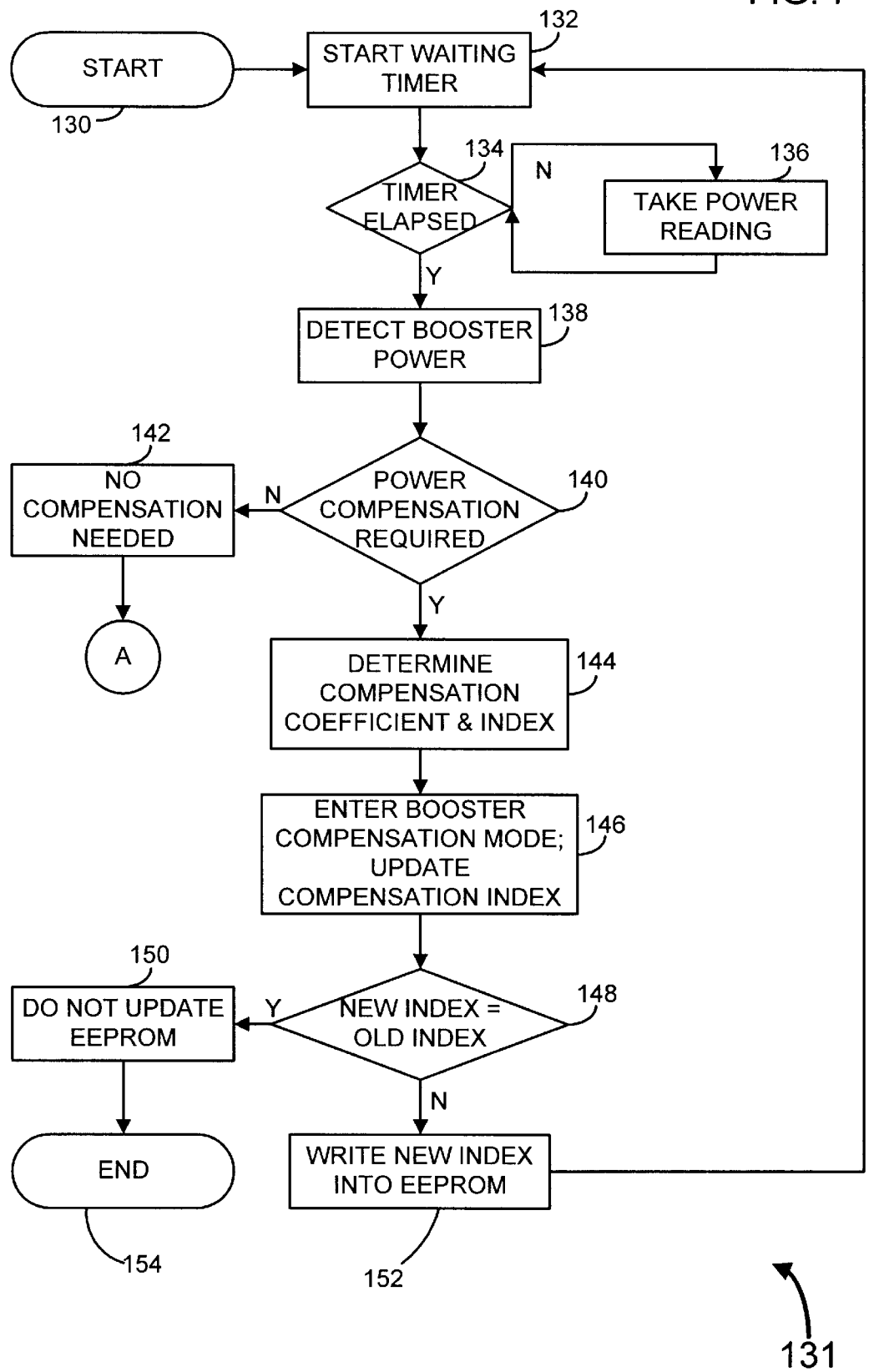
FIG. 7 is a flow diagram showing the flow for the automatic calibration algorithm for the amplifying circuitry with a battery operated radio transceiver operating in analog mode.

Refer to FIG. 7 for a flow diagram showing the algorithmic flow for the automatic calibration algorithm 131 for the booster amplifier 40 (FIG. 1) with a battery operated radio transceiver 30 (FIG. 1) operating in analog mode executing in the CPU 58 (FIG. 3) of the booster amplifier 40 (FIG. 1). The CPU 58 (FIG. 3) starts in the start step 130, where it remains until the radio transceiver 30 (FIG. 1) begins analog voice channel (Vch) transmission. The CPU 58 (FIG. 3) then moves to the start waiting timer block 132 where it waits for the maximum time interval to expire (block 134). During this time interval, a maximum of four readings of the power output of the booster amplifier 40 (FIG. 1) are taken (block 136). These readings are then averaged, labeled as Booster_Power_Out and stored as a hexadecimal value (block 138). The CPU 58 (FIG. 3) then compares Booster_Power_Out with predetermined sets of limits and determines if output power compensation is required (block 140). If the result of the decision is N, then the CPU 58 (FIG. 3) determines that no compensation is needed (block 142) and the CPU 58 (FIG. 3) ends (block 154). The comparison used in step 140 is as follows:

if +14>Power_Booster_Out>=0, then no compensation needed, if 0>Power_Booster_Out>=+14, then compensation is needed, If the result of the decision is Y, then power compensation is required and the CPU 58 (FIG. 3) determines the booster compensation coefficient and the compensation index (block 144) using the table discussed previously.

Once the CPU 58 (FIG. 3) determines the compensation coefficient and the compensation index, it enters the booster compensation mode and updates the compensation index (step 146). Attempting to reduce the number of updates to the EEPROM, which has a finite number of write cycles, the CPU 58 (FIG. 3) compares the new compensation index with the old compensation index that is written in the EEPROM. If the new compensation index is equal to the old compensation index, the flow does not update the EEPROM and then terminates in step 154. If the compensation index values do not match, the CPU 58 (FIG. 3) writes the new compensation index into the EEPROM and then repeats the measurement process, starting again at 132, to confirm proper operation.

Figure 8:
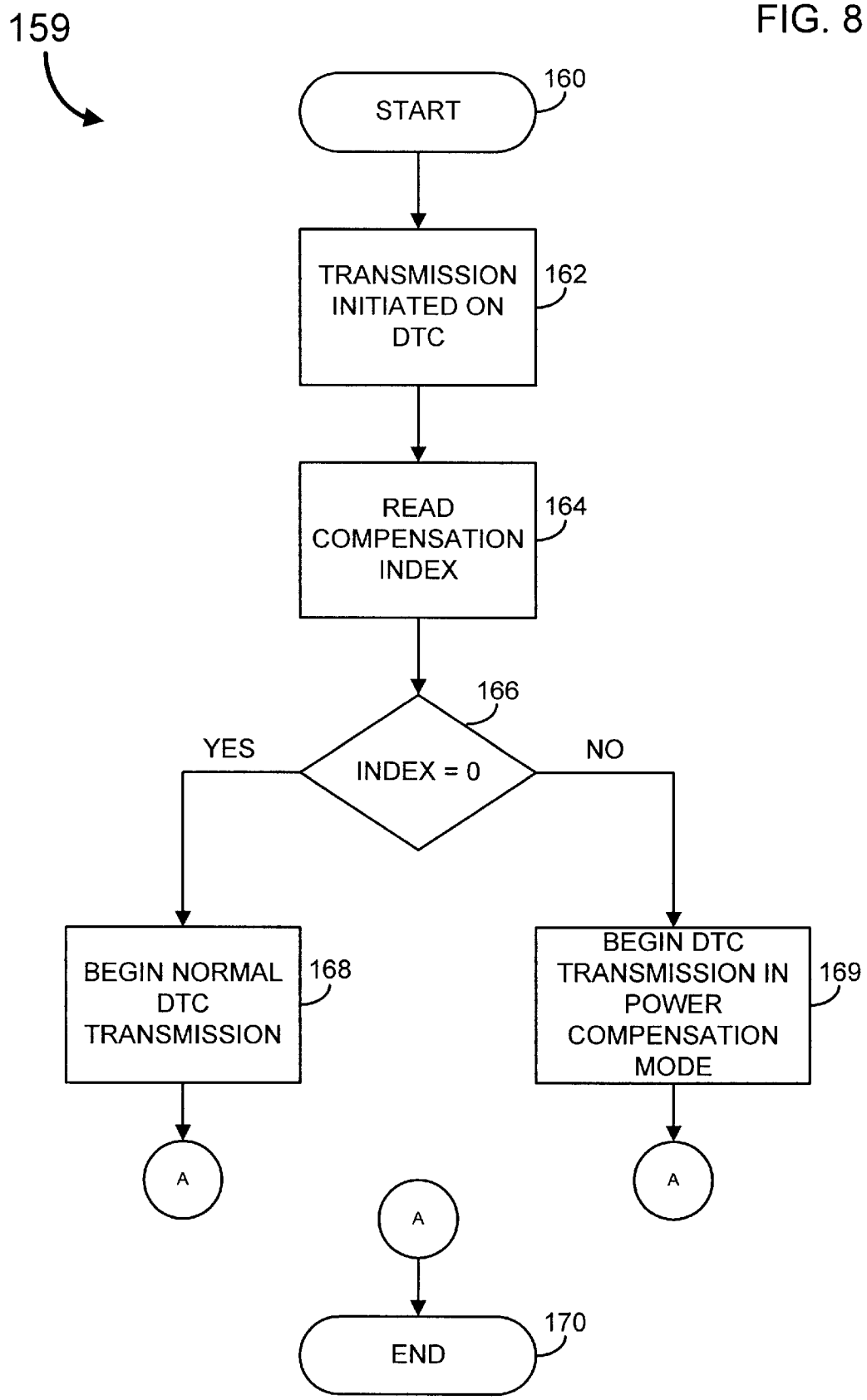
FIG. 8 is a flow diagram showing the flow for the automatic calibration algorithm for the amplifying circuitry with a battery operated radio transceiver operating in digital mode.

Refer to FIG. 8 for a flow diagram showing the flow for the automatic calibration algorithm 159 for the booster amplifier 40 (FIG. 1) with a battery operated radio transceiver 30 (FIG. 1) operating in digital mode executing in the CPU 58 (FIG. 3) of the radio transceiver 30 (FIG. 1). The CPU 58 (FIG. 3) starts in the start step 160, where it remains until a connection is initiated. Once the connection is initiated and the transmission begins on the digital traffic channel (DTC) in step 162, the CPU 58 (FIG. 3) reads the compensation index from the booster in step 164. The CPU 58 (FIG. 3) compares the compensation index to the value zero (0) in decision block 166. If the compensation index is equal to zero, the radio transceiver 30 (FIG. 1) is allowed to begin normal DTC transmission without any compensation (block 168) and once the connection terminates the flow ends in step 170. If the compensation index is not equal to zero, the radio transceiver 30 (FIG. 1) must begin DTC transmission with booster compensation (block 169) and the flow terminates in step 170 once the connection is terminated.

Figure 9:
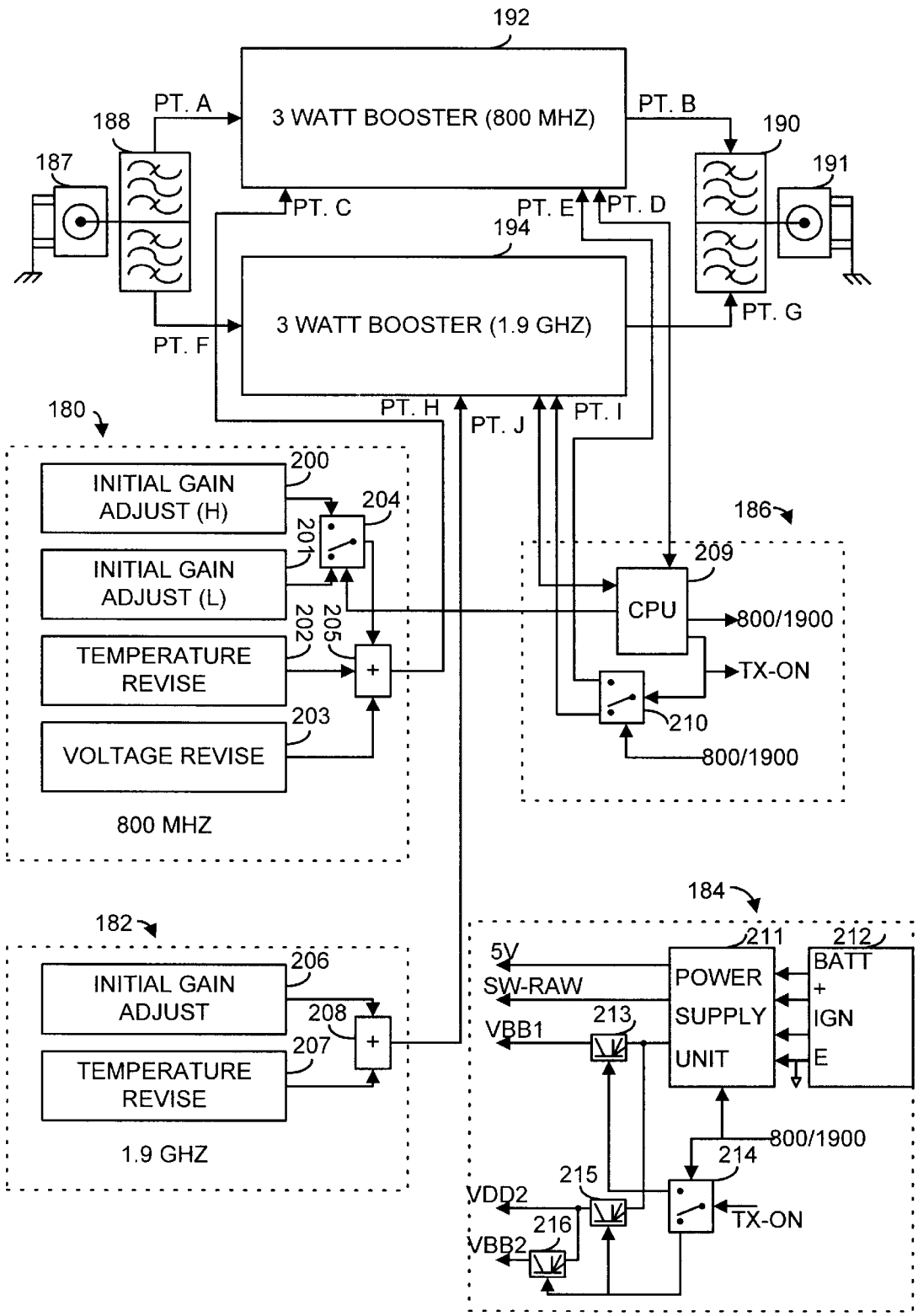
FIG. 9 is a block diagram representation of one preferred embodiment of the amplifying circuitry including power supply and loss compensation circuitry.

Refer to FIG. 9 for a block diagram representation of one preferred embodiment of the booster amplifier 40 (FIG. 1) for the battery operated radio transceiver 30 (FIG. 1) operating in both 800 megahertz and 1.9 gigahertz frequency ranges, including methods for adjusting the gain of said amplifying circuitry for initial gain adjustments, temperature and voltage effects on gain 180 and 182, the power supply 184 for said amplifying circuitry and the central processing unit control 186 for the circuit.

The main amplifying circuit consists of an input duplexer 188 receiving from an input RF coaxial cable 187, two amplifying circuits 192 and 194 (each optimized to operate at different frequencies of interest), and an output duplexer 190, outputting to an output RF coaxial cable 191. The duplexers 188 and 190 are used to permit the simultaneous transmission and reception of two different RF signals at two different frequencies. For example, in the present invention, the input duplexer 188 allows for the reception of radio frequency signals centered around both 800 megahertz and 1.9 gigahertz. The output duplexer 190 permits the simultaneous transmission of radio frequency signals at those two same frequencies. This sequence allows for transmission out to an antenna while not allowing a receiver to pick up the transmitted signal. The two amplifying circuits 192 and 194 are essentially identical except that they are optimized to work at the different frequencies. They will be discussed in greater depth in the following sections of this detailed specification.

The circuit also contains two different blocks 180 and 182 which contain information for providing adjustments to the two amplifying circuits 192 and 194. These two blocks contain information that permit the amplifying circuitry to make adjustments to the initial gain and to make corrections necessitated by operating temperature and voltage. Block 180 provides adjustment information for the amplifying circuit operating at 800 megahertz 192 while block 182 provides the same information for the amplifying circuit operating at 1.9 gigahertz 194.

Block 180 contains two memory locations 200 and 201 which hold the initial high gain adjustment 200 and the initial low gain adjustment 201 for the amplifying circuit 192. These memories contain information concerning the maximum and minimum initial gains permitted by the amplifying circuit 192. Memory 202 contains information about adjustments that are needed due to operating temperature and memory 203 contains information about adjustments that are needed due to operating voltages. The adjustments concerning initial gain are switched (multiplexed) by the switch 204 which is controlled by the central processing unit (CPU) 209. The CPU 209 switches between the high or low gain adjustments depending on its measurement of the output power generated by the amplifying circuitry. The output of the switch 204 and the two memory locations 202 and 203 are added together in an adder 205 and is sent to the amplifying circuit 192 where it will control the amplifiers inside said circuit.

Block 182 operates similarly to block 180, except that due to differences in the standards which specify the way information is transmitted at different frequencies, the block contains no adjustments for initial high and low gain adjustments, only containing adjustment information on the initial gain adjustment 206 and the operating temperature 207 and an adder 208.

Block 186 shows the CPU 209 interaction with the amplifying circuitry. The CPU 209, depending on the mode of operation, i.e., frequency of operation, will select which amplifying circuit 192 or 194 to activate and it will make the proper selection of initial gain adjustments if the operating frequency is 800 megahertz. The CPU 209 also controls if the amplifying circuit will be able to transmit any amplified signals (connection points D and J). The switch 210 switches between the two operating frequencies, asserting a select line and selecting the proper amplifying circuit 192 or 194.

Block 184 is the power supply for the amplifying circuit. It generates the control and operating voltages for the two amplifying circuits 192 and 194. A power supply unit 211 generates voltages from the vehicle battery 34 (FIG. 1) through circuit 212. Multiple transistors 213, 215, and 216 are used as switches to control which power lines are active. A switch 214 controls which amplifying circuit 192 or 194 gets the needed power to transmit the output signal. The switch 214 receives a control signal regarding the proper amplifying circuit 192 or 194 from the CPU 209.

Figure 10:
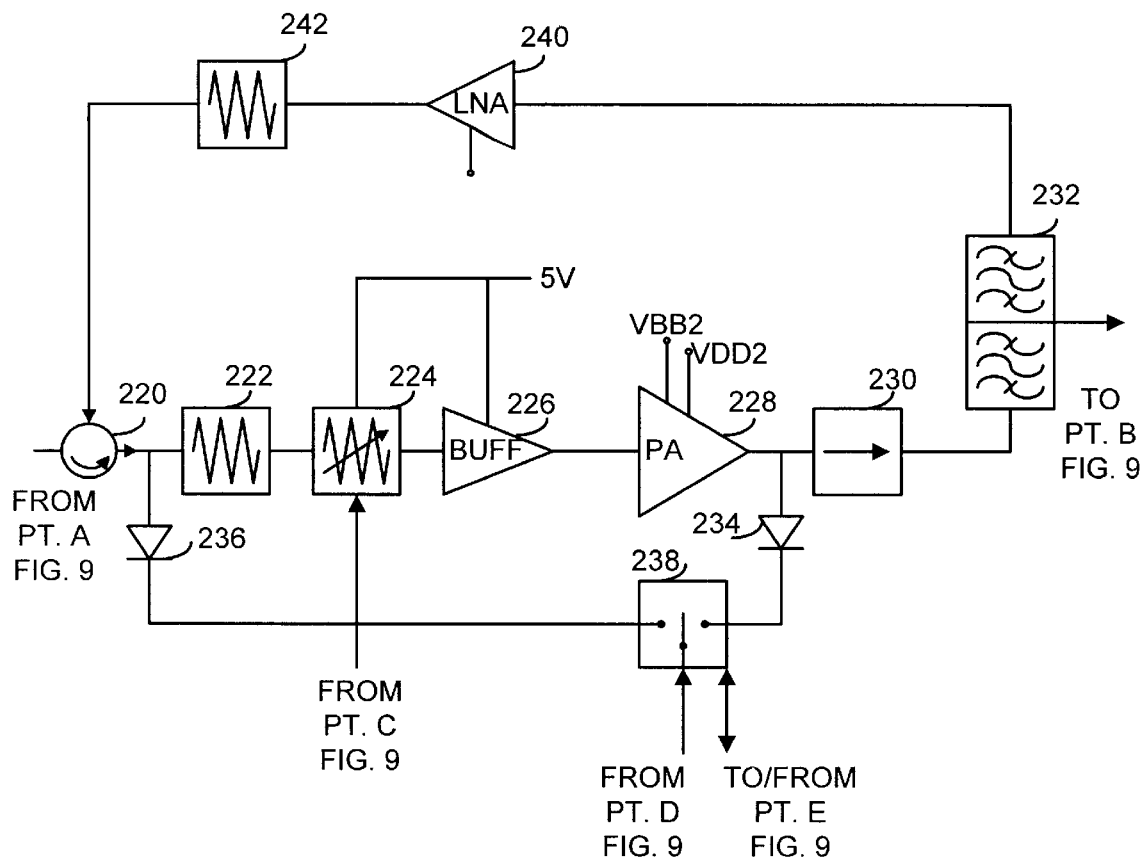
FIG. 10 is a block diagram representation of one embodiment of the amplifying circuitry for the battery operated radio transceiver operating in the 800 megahertz frequency range.

Refer to FIG. 10 for a block diagram representation of one embodiment of the amplifying circuitry 192 (FIG. 9) for the battery operated radio transceiver 30 (FIG. 1) operating in the 800 megahertz frequency range. The radio signal from connection point A from FIG. 9 is combined with the received radio signal in a radio frequency combiner 220. The combined signal is then attenuated by two attenuators 222 and 224. Attenuator 222 is a fixed attenuator while 224 is a variable attenuator which receives its control from connection point C from FIG. 9, the 800 megahertz initial compensation memories 180 (FIG. 9). The control of the variable attenuator 224 performs the initial adjustments to compensate for temperature, voltage, and gain compensation. The attenuated signal is buffered in buffer 226 and then amplified in a power amplifier (PA) 228. The PA 228 has two control voltages Vbb2 and Vdd2. Vdd2 is the supply voltage, i.e., the voltage needed by the PA to operate. Vbb2 is the reference voltage, i.e., the maximum voltage that the PA will amplify the input signal to. An isolator 230 provides an electrical separation between the PA 228 and a duplexer 232. The output of the duplexer 232 goes out connection point B back to FIG. 9, the duplexer 190 (FIG. 9).

Two diodes 234 and 236 are used to "turn off" the transmission portion of the amplifier circuit. The diodes are controlled by the switch 238 which is in turn controlled by connection point E from FIG. 9. Connection point E is from switch 210 (FIG. 9) which is used to select between the two amplifying circuits, either 192 or 194 (FIG. 9). Connection point D is from the CPU 209 (FIG. 9) and provides the voltage to reverse bias the two diodes 234 and 236.

The receive portion of the radio frequency signal is separated from the overall transmission signal by the duplexer 232 and is sent to a low noise amplifier 240 which is inductively coupled to an attenuator 242. This low noise amplifier 240 may also be replaced by a bandpass filter (not shown). After amplification, it is attenuated by the attenuator 242 and recombined with the incoming signal in the combiner 220.

Figure 11:
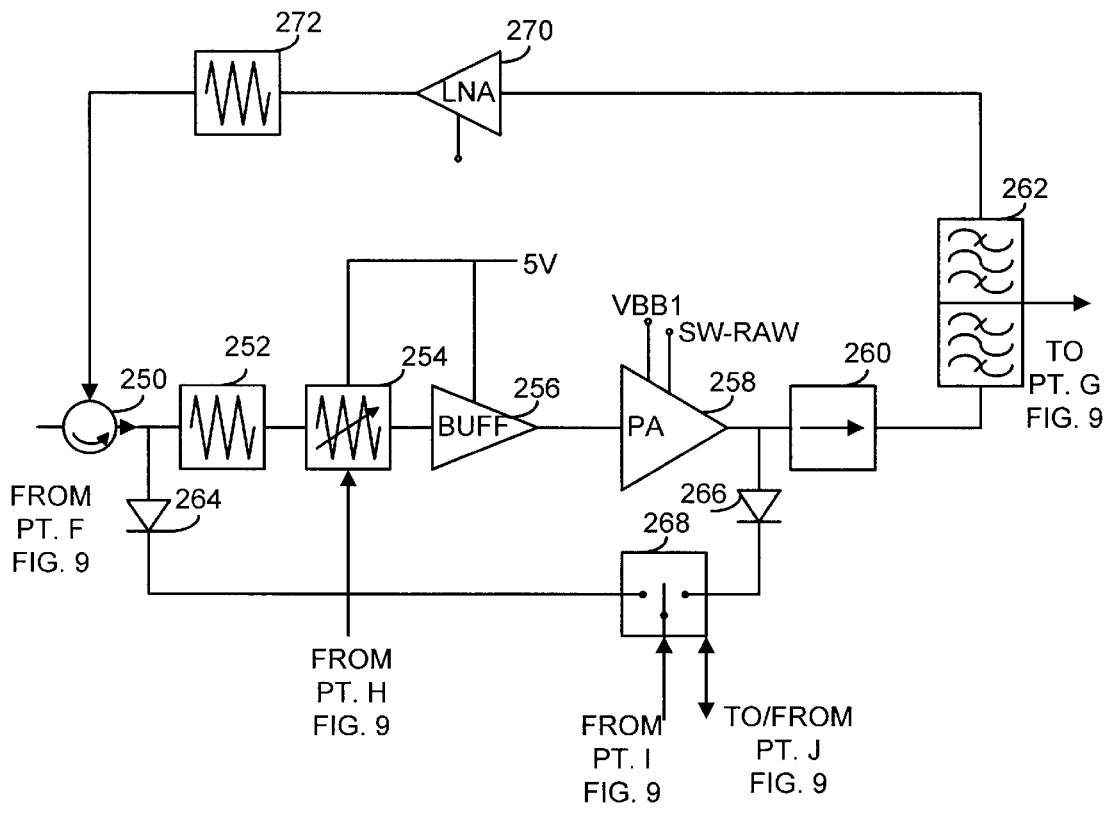
FIG. 11 is a block diagram representation of one preferred embodiment of the amplifying circuitry for the battery operated radio transceiver operating in the 1.9 gigahertz frequency range.

Refer to FIG. 11 for a block representation of a preferred embodiment of the amplifying circuitry for the battery operated radio transceiver 30 (FIG. 1) operating in the 1.9 gigahertz frequency range. This amplifying circuit is identical to the amplifying circuit shown in FIG. 10 with the exception of the supply voltages to the power amplifier 258. The voltage Vbb1 is the maximum output voltage for the power amplifier 258 while the SW-RAW is the switched power input when the radio transceiver is present, this power input being the power supply voltage. In the interest of brevity, this amplifying circuit will not be discussed.

Figure 12:
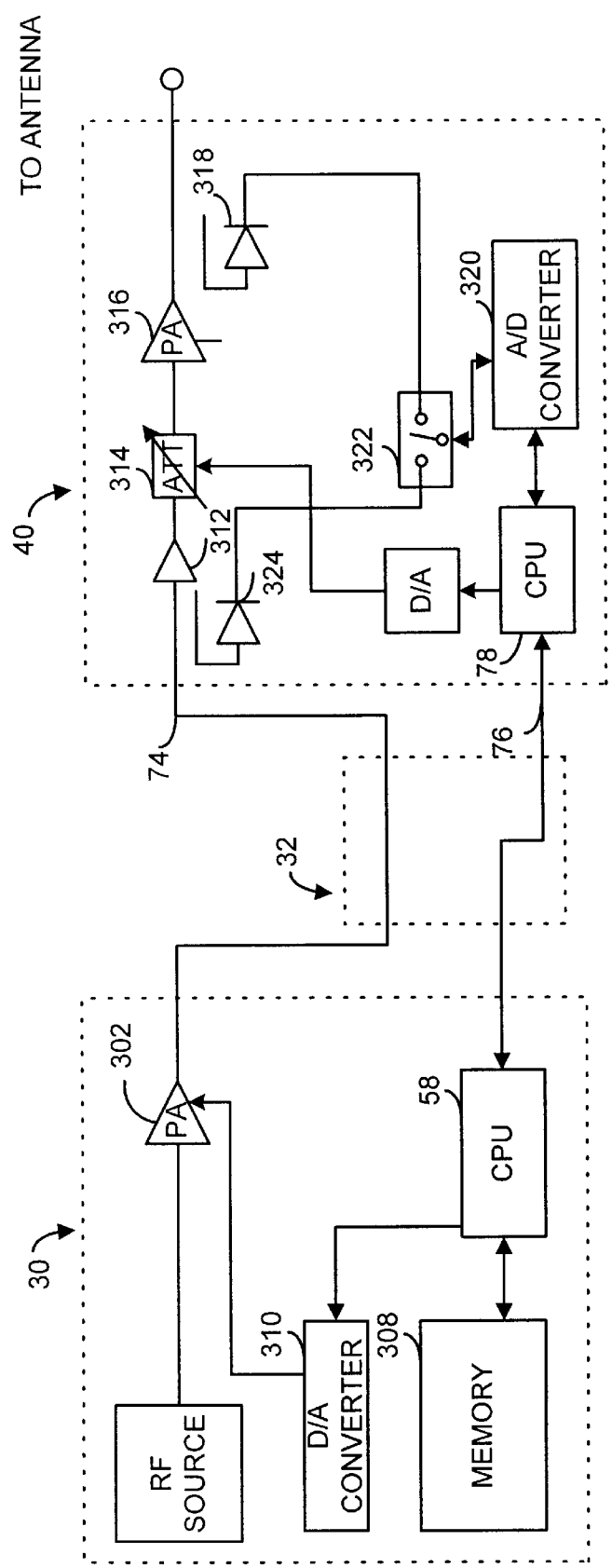
FIG. 12 is a block diagram representation of selected transmit portions of an automotive application of the amplifying circuitry, in accordance with another preferred embodiment of the present invention.

Refer to FIG. 12 for a block diagram representation of selected transmit portions of an automotive application of the amplifying circuitry, in accordance with another preferred embodiment of the present invention. Again, only the transmit portion of the circuitry is shown. The holder 32 and the radio transceiver 30 are similar to those shown in FIG. 5. The booster amplifier 40 (FIG. 1) has an additional feature. Again, there is a buffering amplifier 312 for the output of the radio transceiver 30 (FIG. 1), a variable attenuator 314 and a PA 316. However, there is an additional diode 324 which couples the signal at the buffering amplifier 312. The diode 324 generates a signal strength indicator of the signal at the input of the booster amplifier 40 (FIG. 1). Again, there is a diode 318 at the output of the PA 316 that generates the transmitted signal strength indicator. The two signal strength indicators from the two diodes 318 and 324 are selected via a switch 322 and sent through an A/D converter 320. The digital signal strength indicator is sent to the CPU 78 (FIG. 5) of the booster amplifier 40 (FIG. 1) which in turn communicates to the CPU 58 (FIG. 3) in the radio transceiver 30 (FIG. 1) to control the gain of the AGC 314.

Figure 13:
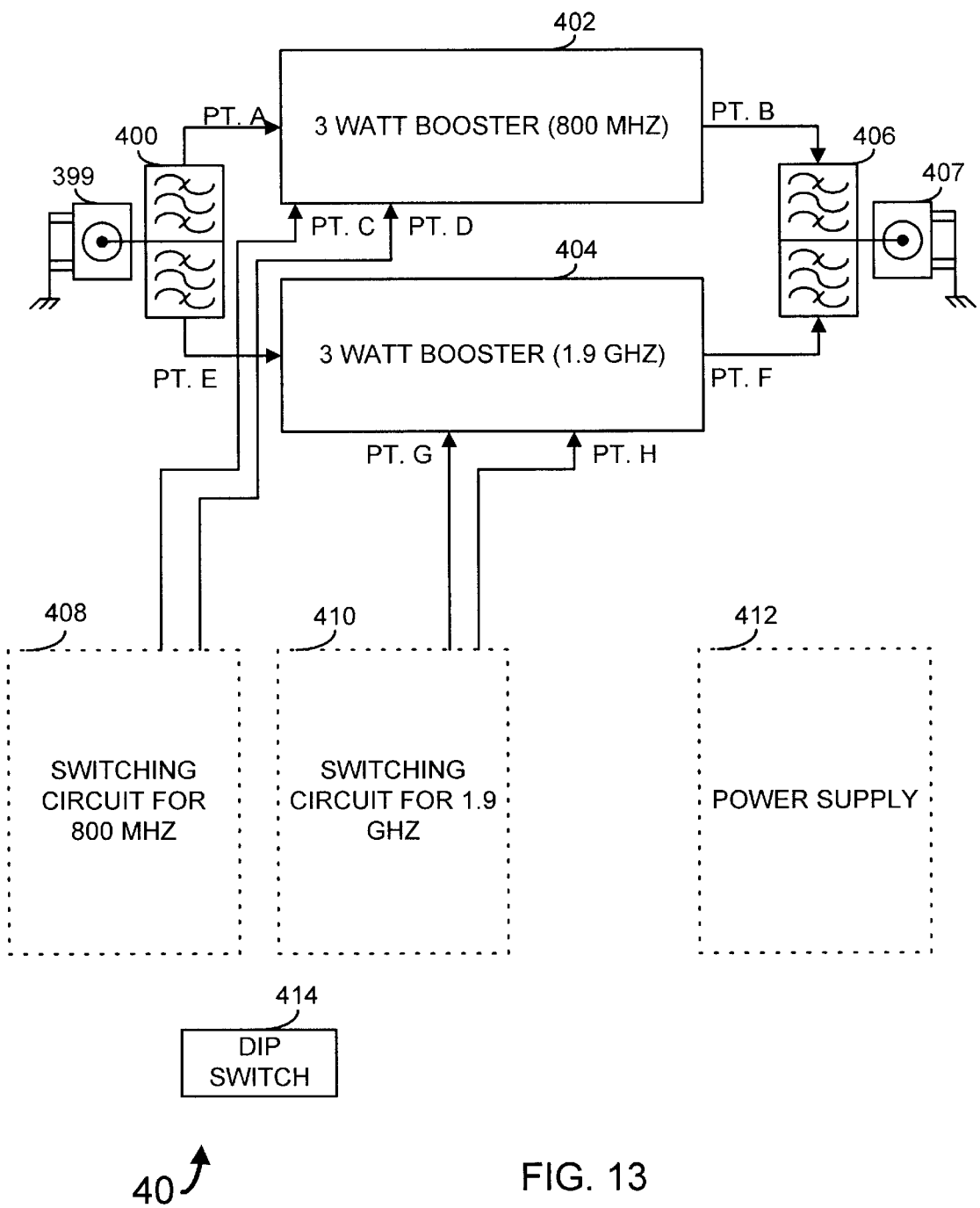
FIG. 13 is a block diagram representation of another preferred embodiment of the amplifying circuitry including power supply, loss compensation circuitry, and switch bank for configuring amplifier.

Refer to FIG. 13 for another preferred embodiment of the present invention. The block diagram represents the booster amplifier 40 (FIG. 1) for the battery operated radio transceiver 30 (FIG. 1) operating in both 800 megahertz and 1.9 gigahertz frequency ranges, including methods for adjusting the gain of said amplifying circuitry for initial gain adjustments, temperature and voltage effects on gain, the power supply for said booster amplifier and the central processing unit control for the circuit (not shown). The block diagram also shows a preferred method for providing a mechanism for compensating loss in signal strength due to the cabling used in the installation of the amplifying circuitry, i.e., a dip switch 414. This dip switch 414 is preset by the user or installer of the power amplifier circuitry to signify the length of the cable being used in the installation of this embodiment, thereby informing the booster amplifier 40 of the amount of amplification needed to compensate for cable loss. This cable loss is then added to the 8 dB linear gain selectively supplied by the booster amplifier 40.

The main amplifying circuit consists of an input coaxial connector 399, an input duplexer 400, two amplifying circuits 402 and 404 (each optimized for operation at the different frequencies of interest), an output duplexer 406, and an output coaxial connector 407. The duplexers 400 and 406 are used to permit the simultaneous transmission and reception of two different signals at two different frequencies. For example, in the present invention, the input duplexer 400 allows the reception of radio frequency signals centered around 800 megahertz and 1.9 gigahertz. The output duplexer 406 permits the simultaneous transmission of radio frequency signals at those two frequencies. The two amplifying circuits 402 and 404 are essentially identical with the exception that they are optimized to operate at the different frequencies, as discussed below.

The circuit also contains two different blocks 408 and 410 which contain information for providing adjustments to the two amplifying circuits 402 and 404. These two blocks contain information that permit the amplifying circuitry to make adjustments to the initial gain and to make corrections necessitated by operating temperature and voltage. Block 408 provides adjustment information for the amplifying circuit operating at 800 megahertz 402 while block 410 provides the same information for the amplifying circuit operating at 1.9 gigahertz 404.

Block 412 is the power supply for the amplifying circuit. It generates the control and operating voltages for the two amplifying circuits. Detailed descriptions for blocks 408, 410, and 412 will be in the following sections.

As previously mentioned, the preferred method for compensating for losses in signal strength due to the cabling used in the installation of the amplifying circuitry is a bank of manually configured dual-in-packaged switches (DIP switches) 414. Through the proper configuration of said switches, the user or the installer of the booster amplifier 40 (FIG. 1) can provide information to the CPU 78 (FIG. 5) of the booster amplifier 40 (FIG. 1) needed to adjust the amplifiers 402 and 404 in the booster amplifier 40 (FIG. 1) to compensate for the cabling loss.

Figure 14:
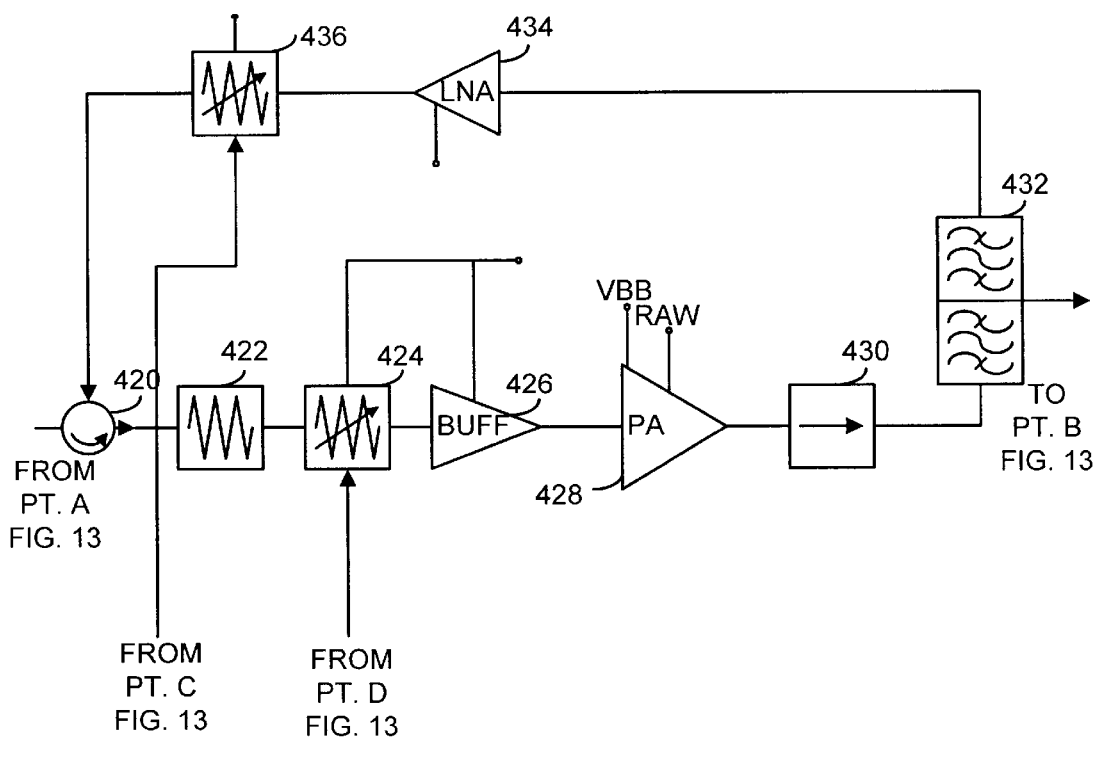
FIG. 14 is a block diagram representation of one preferred embodiment of the amplifying circuitry for the battery operated radio transceiver operating in the 800 megahertz frequency range.

Refer to FIG. 14 for a detailed block diagram of one preferred embodiment of the present invention for the amplifying circuit 402 that operates at the 800 megahertz frequency range. The radio signal from connection point A from FIG. 13 is combined with the received radio signal in a radio frequency combiner 420. The combined signal is then attenuated by two attenuators 422 and 424. Attenuator 422 is a fixed attenuator while 424 is a variable attenuator which receives its control from connection point D from FIG. 13. The control of the variable attenuator 424 performs the initial adjustments to compensate for temperature, voltage, and gain compensation for the transmit portion of the radio signal. The attenuated signal is buffered in buffer 426 and then amplified in a power amplifier (PA) 428. The PA 428 has two control voltages VBB and RAW. RAW is the supply voltage, i.e., the voltage needed by the PA to operate. VBB is the reference voltage, i.e., the maximum voltage that the PA will amplify the input signal to. An isolator 430 provides a separation between the PA 428 and a duplexer 432, i.e., the isolator 430 provides isolation between the circuitry and the transmitted signal. The output of the duplexer 432 goes out through connection point B back to FIG. 13.

The receive portion of the radio frequency signal is separated from the overall signal by the duplexer 432 and is sent to a low noise amplifier 434. After amplification, it is attenuated by a variable attenuator 436 and recombined with the incoming signal in the combiner 420. The control for the variable attenuator 436 comes from the connection point C from FIG. 13. These adjustments pertain to the presence of a coiled connection cord in the installation and the initial gain and temperature adjustments for the receive portion of the radio signal.

Figure 15:
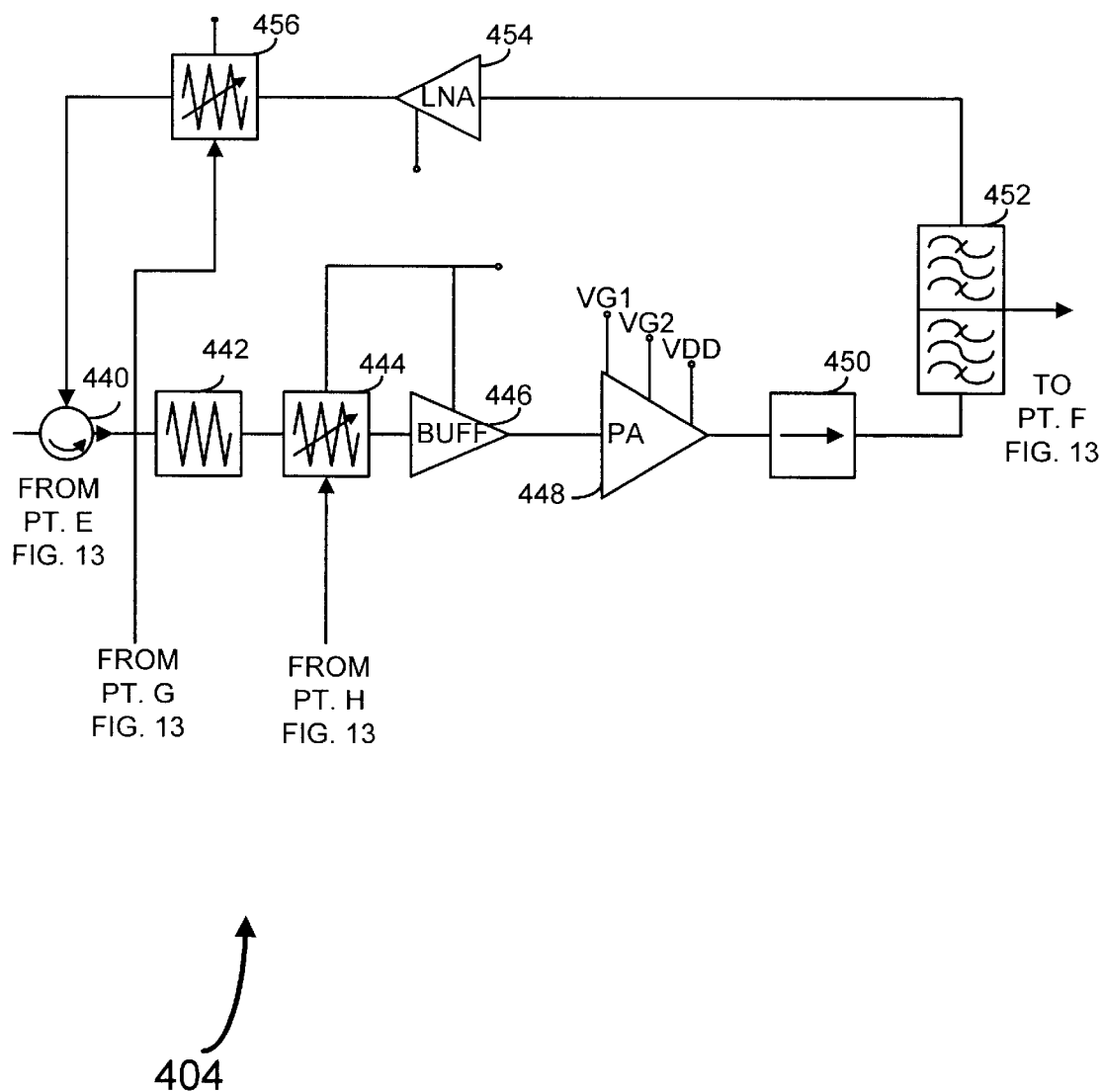
FIG. 15 is a block diagram representation of one preferred embodiment of the amplifying circuitry for the battery operated radio transceiver operating in the 1.9 gigahertz frequency range.

Refer to FIG. 15 for a block diagram representation of a preferred embodiment of the amplifying circuitry 404 for the battery operated radio transceiver operating in the 1.9 gigahertz frequency range. This amplifying circuit is identical to the amplifying circuit 402 shown in FIG. 14 with the exception of the voltages VG1, VG2, and VDD supplied to the power amplifier 448. VG1 and VG2 provide the upper and lower rail voltages for the power amplifier 448 and VDD is the power supply voltage. In the interest of brevity, this amplifying circuit will not be discussed.

Figure 16:
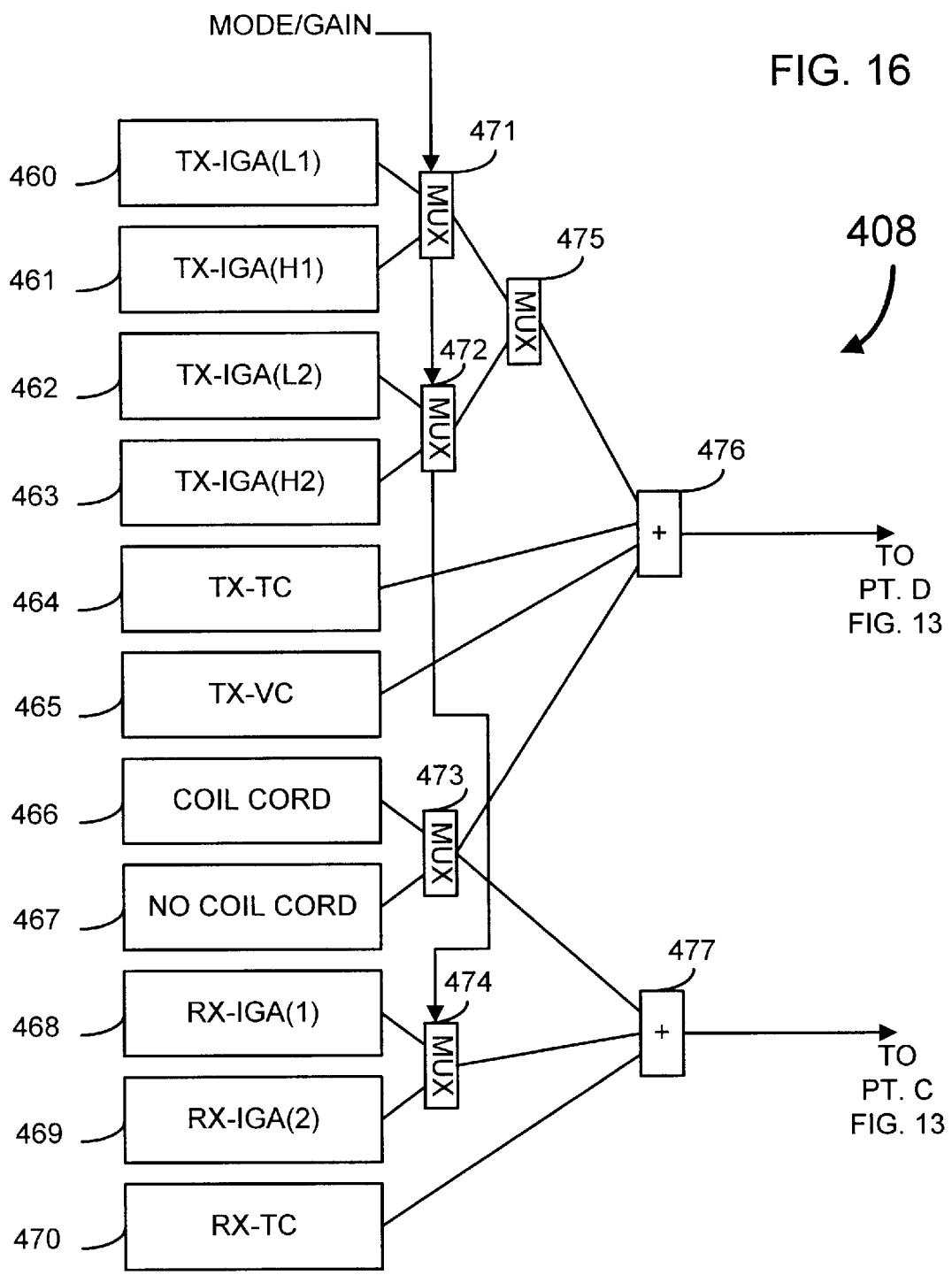
FIG. 16 is a block diagram representation of one preferred embodiment of the initial gain adjustment method for compensation of signal loss due to cabling for the battery operated radio transceiver operating in the 800 megahertz frequency range.

Refer to FIG. 16 for a block diagram of the circuitry used to make adjustments 408 to the amplifying circuitry 402 operating in the 800 megahertz frequency range. The adjustment circuitry consists of memory 460 through 470, multiplexors 471 through 475, and adders 476 and 477. The memory locations are as follows: first low initial gain adjustment for transmission 460, first high initial gain adjustment for transmission 461, second low initial gain adjustment for transmission 462, second high initial gain adjustment for transmission 463, temperature adjustment for transmission 464, voltage adjustment for transmission 465, presence of a coiled connection cord 466, lack of a coiled connection cord 467, first initial gain adjustment for receiving 468, second initial gain adjustment for receiving 469, and temperature adjustment for receiving 470. The memory locations are pre-loaded with typical compensation values during manufacture. Multiplexors 471, 472, 473, 474, and 475 are preset to select between the high and low initial gain adjustments and the presence or lack of coiled connection cord. The adder 476 combines the adjustments for the transmission and the coil cord together and the output is sent to connection point D of FIG. 13. The adder 477 combines the adjustments for the receiving and the coil cord together and the output is sent to the connection point C of FIG. 13.

Figure 17:
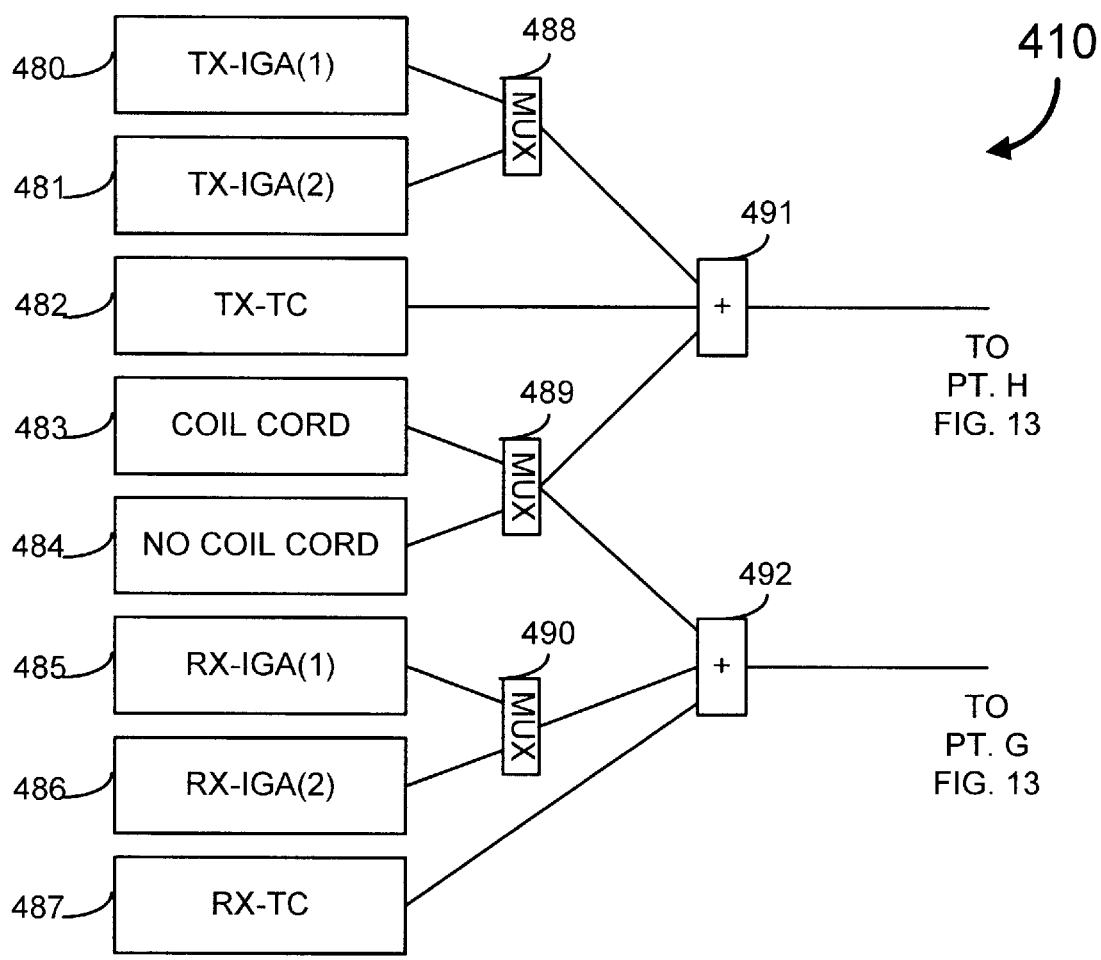
FIG. 17 is a block diagram representation of one preferred embodiment of the initial gain adjustment method for compensation of signal loss due to cabling for the battery operated radio transceiver operating in the 1.9 gigahertz frequency range.

Refer to FIG. 17 for a block diagram of the initial gain compensation circuitry 410 used to make adjustments to the amplifying circuitry 404 operating in the 1.9 gigahertz frequency range. The adjustment circuitry consists of memory 480 through 487, multiplexors 488, 489, and 490, and adders 491 and 492. The circuitry 410 is similar to the circuitry 408 shown in FIG. 16. However, differences exist due mainly to different transmission standards for signals operating at the two different frequencies. The memory locations are as follows: first gain adjustment for transmission 480, second gain adjustment for transmission 481, temperature adjustment for transmission 482, presence of coiled connection cord 483, lack of coiled connection cord 484, first gain adjustment for receiving 485, second gain adjustment for receiving 486, and temperature adjustment for receiving 487. Multiplexors 488, 489, and 490 select between first and second gain adjustments and for the presence or lack of coiled connection cord. The adder 491 combines the adjustments for the transmission and coiled cord together and the output is sent to connection point H of FIG. 13. The adder 492 combines the adjustments for the receiving and the coiled cord together and the output is sent to connection point G of FIG. 13.

Figure 18:
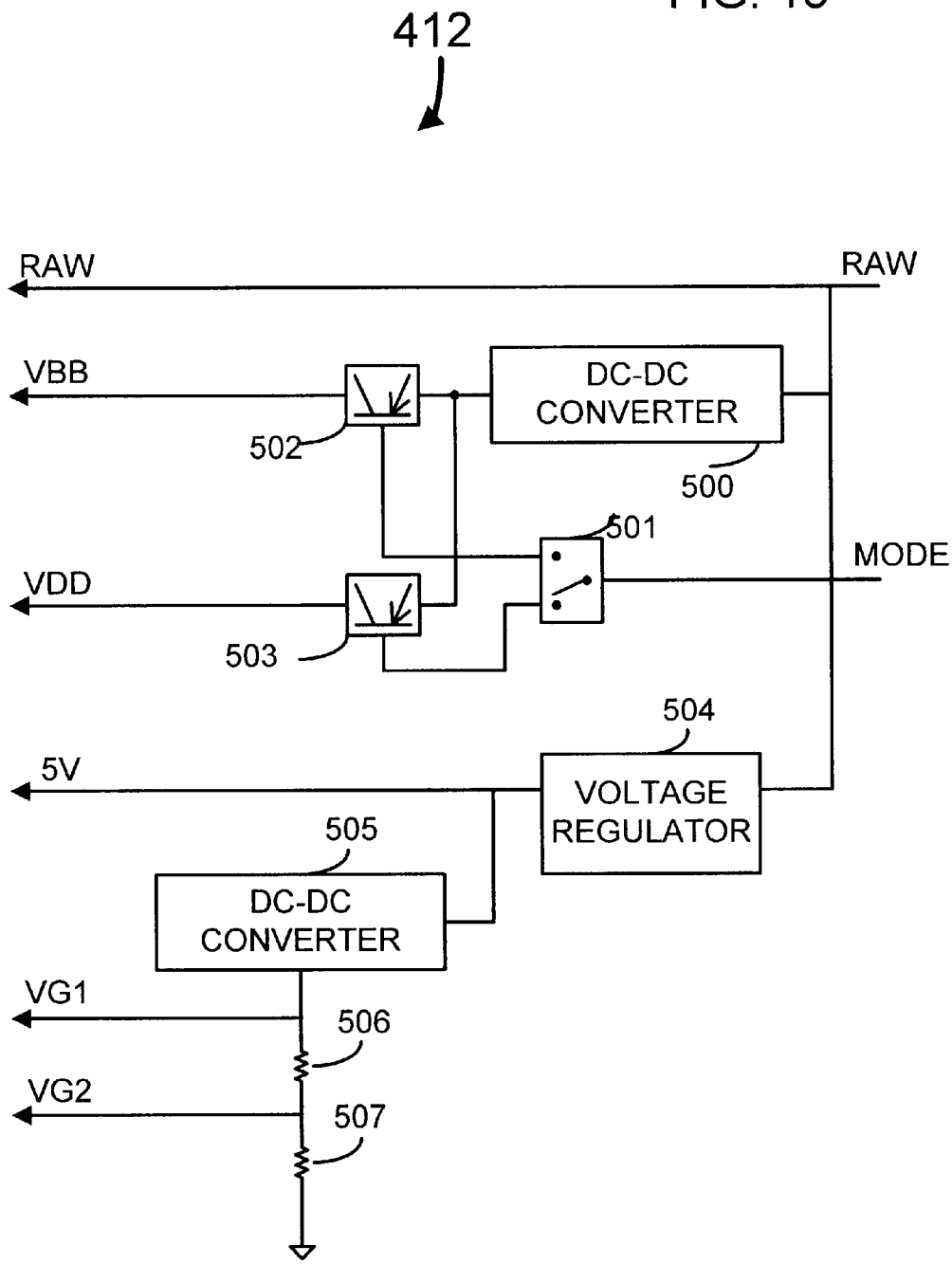
FIG. 18 is a block diagram representation of one preferred embodiment of the power supply for the amplifying circuitry.

Refer to FIG. 18 for a detailed block diagram of the power supply 412 of the preferred embodiment of the present invention. The power supply 412 has two input lines, RAW and MODE. RAW is the voltage from the vehicle battery 34 (FIG. 1) and MODE is the frequency range the radio transceiver 30 (FIG. 1) is operating in. The DC—DC converter 500 converts the RAW voltage to a different voltage level and has one output line that is split into two. The switch 501 selects which of the two output lines of the DC—DC converter 500 is enabled. The two lines from the DC—DC converter 500 are also controlled by two transistors 502 and 503 which operate as on/off switches. Hence, depending on the value of the MODE input line, either VBB or VDD are enabled.

A voltage regulator 504 provides a constant 5 volt output while a second DC—DC converter 505 converts the said 5 volts to another specified voltage. The two resistors 506 and 507 provide a voltage divider network to provide two additional voltage levels VG1 and VG2.

Figure 19:
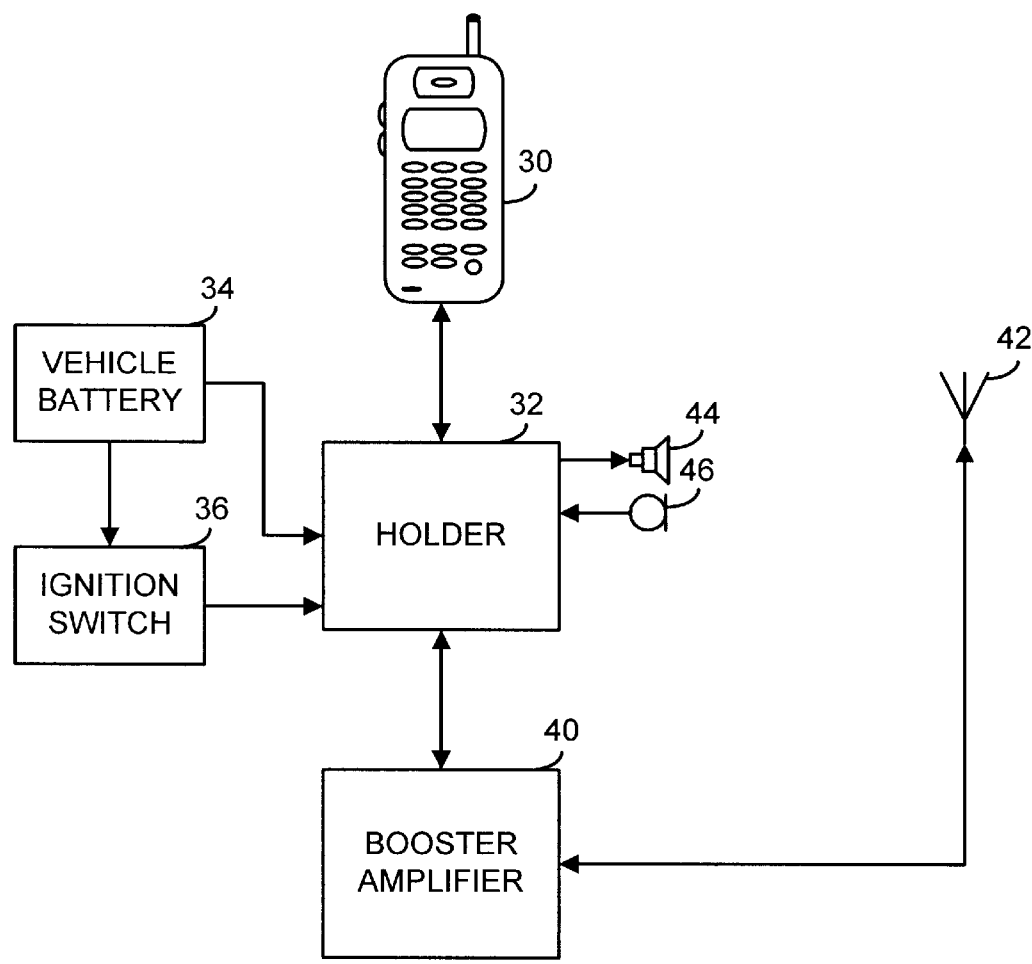
FIG. 19 is a block diagram representation of another preferred embodiment of the automobile application of said amplifying circuitry and accessory items and the radio transceiver.

Refer now to FIG. 19 for a block diagram of another preferred embodiment of an automobile application of the battery operated radio transceiver 30 (FIG. 1), booster amplifier 40 (FIG. 1), and holder 32 (FIG. 1). This embodiment is almost identical to the embodiment shown in FIG. 1. Unlike the first preferred embodiment (FIG. 1), this embodiment does not have additional devices connected to the booster circuit 40 (FIG. 1) but instead to the holder 32, thus the holder 32 includes, at least, circuitry to interface with and control elements 34, 36, 44, and 46.

Figure 20:
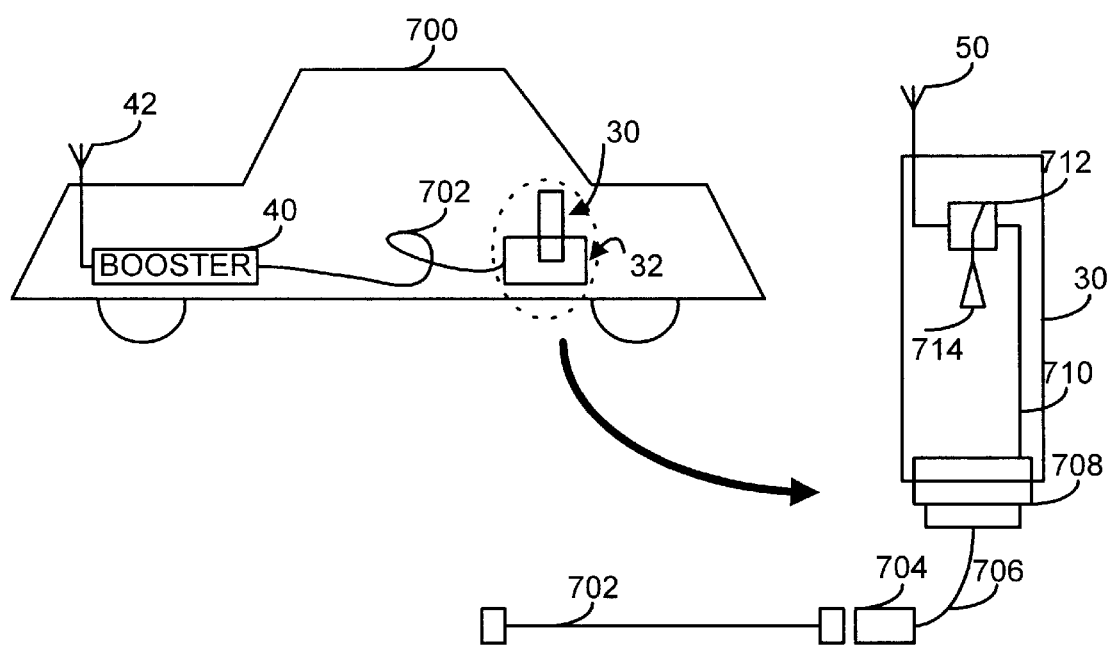
FIG. 20 is a block diagram representation of a possible automotive application installation.

Refer to FIG. 20 for a block diagram representing one preferred embodiment of the installation of the amplifying circuitry in an automotive application, showing signal strength loss due to cabling used in the installation. The automobile 700 has an external antenna 42 (FIG. 1) which is connected to the booster amplifier 40 (FIG. 1) via a short cable. The booster amplifier 40 (FIG. 1) is connected to the holder 32 (FIG. 1) via a cable 702 and the holder 32 (FIG. 1) contains the radio transceiver 30 (FIG. 1). The losses associated with the installation is shown in the exploded figure. The losses from the cable is shown as the line 702 while 704 models the loss associated with the cabling inside the amplifier circuitry. Element 708 is the connector connecting the holder 32 to the radio transceiver 30 (FIG. 1) while element 710 is the loss associated with the semi-rigid cable inside the radio transceiver 30 (FIG. 1). Block 712 is a switch that enables transmission of the radio signal out of the radio transceiver 30 (FIG. 1), through the antenna 50 (FIG. 3) and is controlled by control 714.

Amplification by the booster amplifier 40 (FIG. 1) of the output signal from the radio transceiver 30 (FIG. 1), when in CDMA mode, also requires modification. While CDMA mode does not require general power amplification, due to its 16 dB process gain, the power loss associated with cable 702 does have to be compensated, as is described in the aforementioned detailed specification.

Figure 21:
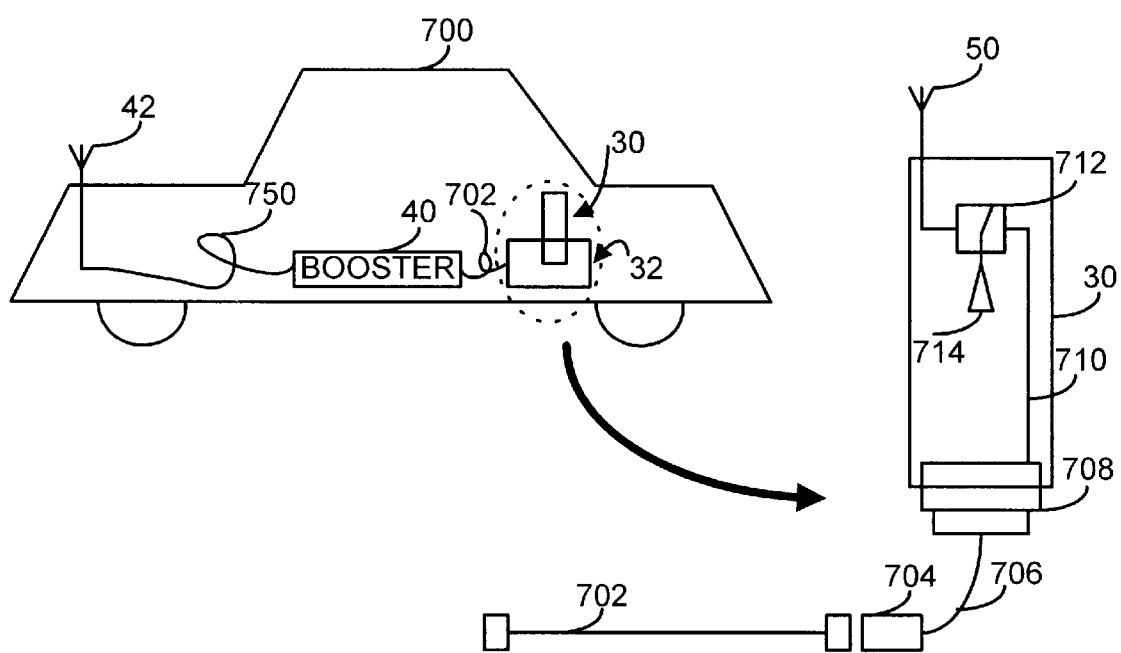
FIG. 21 is a block diagram representation of another possible automotive application installation.

Refer to FIG. 21 for a block diagram representing another preferred embodiment of the installation of the amplifying circuitry in an automotive application, showing sources of signal strength loss due to cabling used in the installation. The automobile 700 has an external antenna 42 which is connected to the booster amplifier 40 (FIG. 1) via a long cable 750. The booster amplifier 40 (FIG. 1) is connected to the holder 32 (FIG. 1) via a short cable 702. The losses from the long cable 750 are neglected because it is prior to the booster amplifier 40 (FIG. 1) and any power loss is compensated automatically by the booster amplifier 40 (FIG. 1). The losses associated with the installation is shown in the exploded figure. Element 702 models the loss associated with the short cable. The remainder of the loss model is the same as in FIG. 20.

Figure 22:
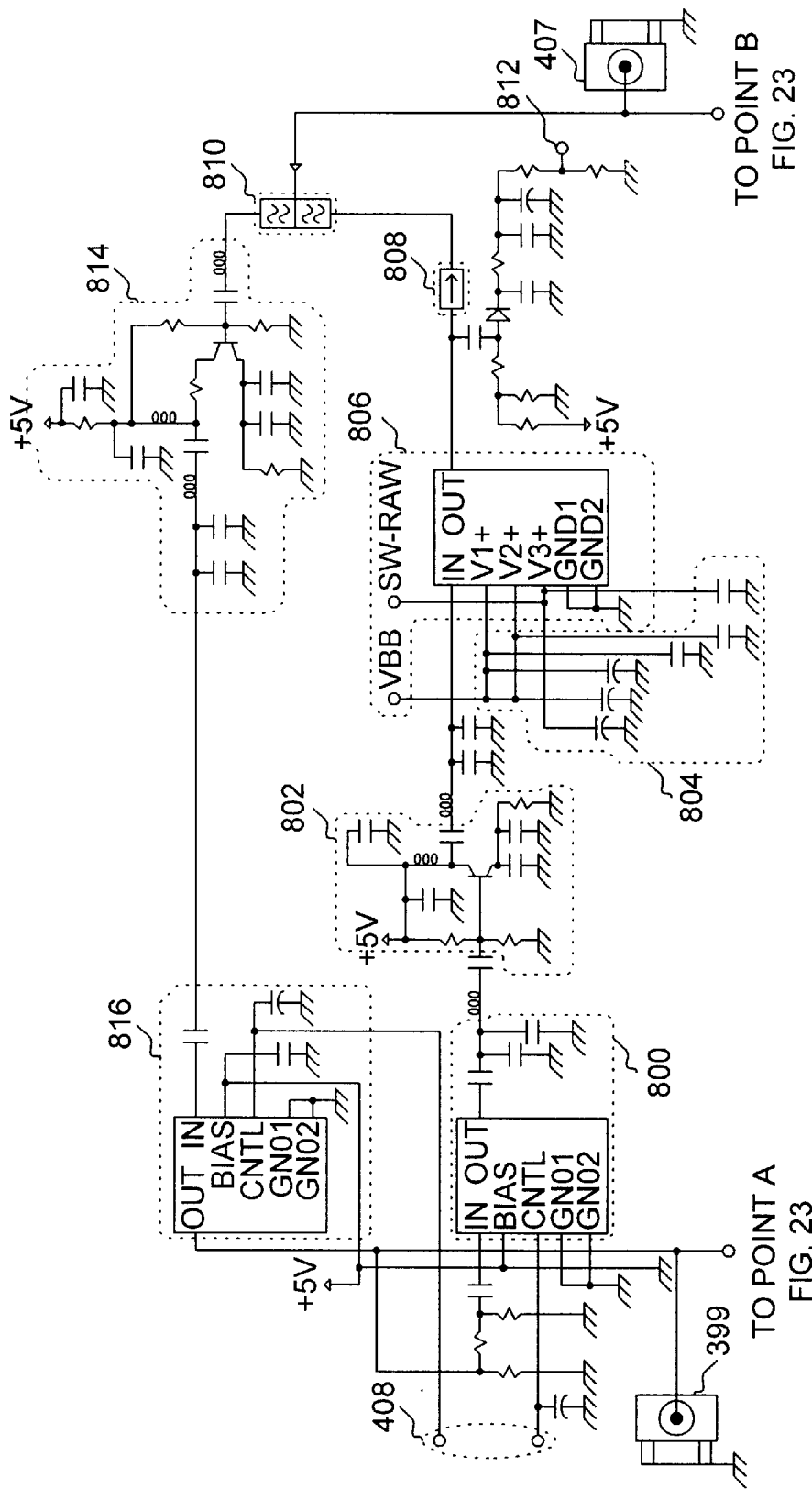
FIG. 22 is a further detailed block diagram depicting the amplifying circuitry of one preferred embodiment of the present invention for operation at the 800 megahertz frequency range.

Refer to FIG. 22 for a further detailed block diagram depicting the circuitry of the preferred embodiment of the present invention for the amplifying circuit 402 in FIG. 14 that operates at the 800 megahertz frequency range. A transmitted audio RF signal is received from the gain adjustment circuitry 408 of FIG. 16 which is first amplified by a voltage controlled fixed attenuator 800. The RF signal is then attenuated by a variable attenuator 802. The attenuated signal is buffered in buffer 804 and then amplified in power amplifier (PA) 806. The PA 806 has two control voltages VBB and SW-RAW. SW-RAW is the switched power input when the radio transceiver 30 (FIG. 1) is present, while VBB is the reference voltage, i.e., the maximum voltage that the PA 806 will amplify the input signal to. A cable length indicator 812 is provided which provides the amplifier circuit with the necessary amount of cable loss to compensate for. An isolator 808 provides a separation between the PA 806 and a duplexer 810 i.e., the isolator 808 provides isolation between the circuitry and the transmitted signal. The output of the duplexer 810 goes to an output RF coaxial cable 407.

The receive portion of the radio frequency signal is separated from the overall signal by the duplexer 810 and is sent to a low noise amplifier 814. After amplification, it is attenuated by the attenuator 816, which in turn is inductively coupled to the low noise amplifier 814, and connected to the input RF coaxial cable 399. The control for the attenuator 816 comes from the gain adjustment circuitry 408 of FIG. 13. These adjustments pertain to the presence of a coiled connection cord in the installation and the initial gain and temperature adjustments for the receive portion of the radio signal.

Figure 23:
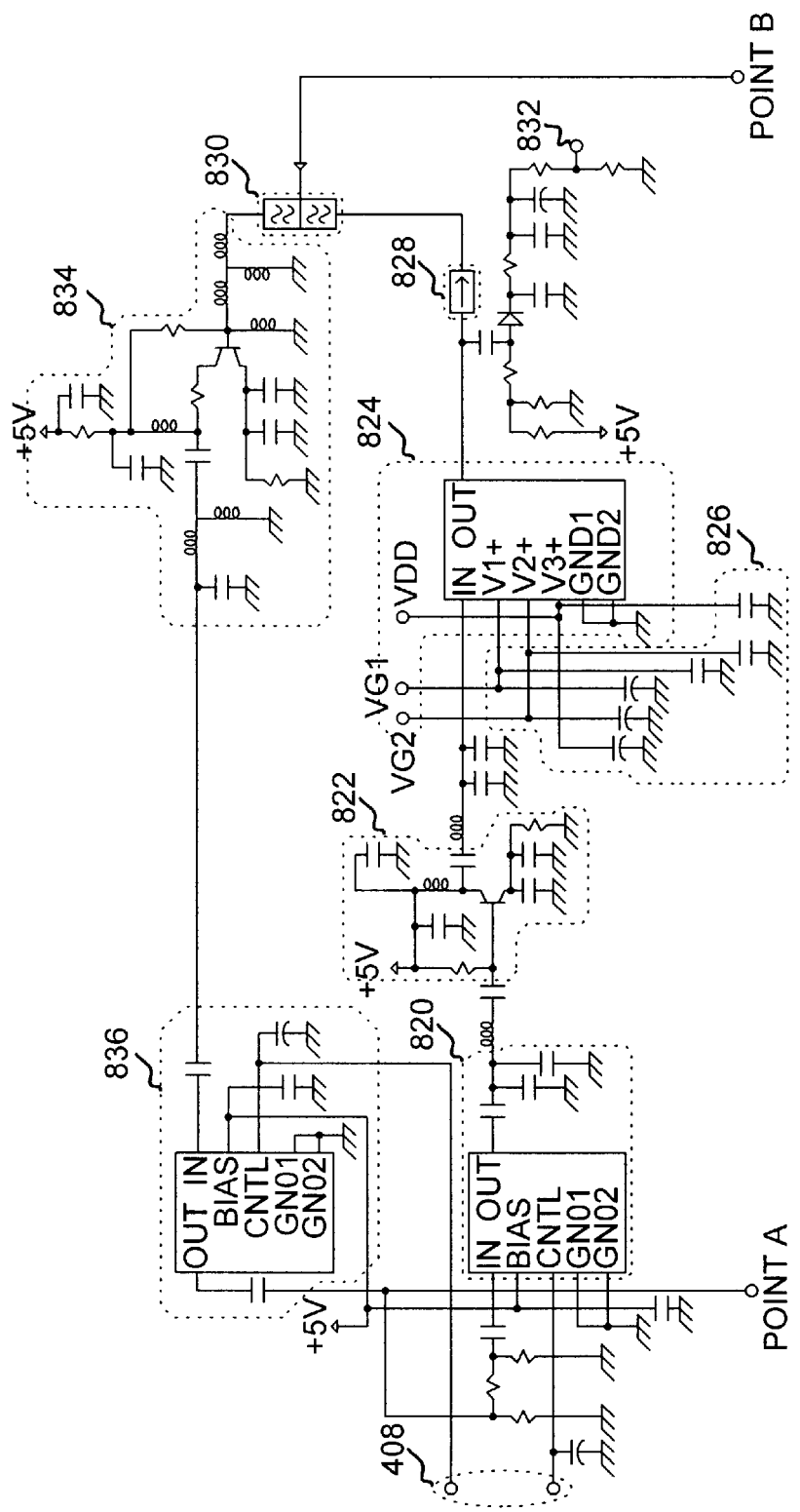
FIG. 23 is a further detailed block diagram depicting the amplifying circuitry of one preferred embodiment of the present invention for operation at the 1.9 gigahertz frequency range.

Refer to FIG. 23 for a further detailed block diagram depicting the circuitry of the preferred embodiment of the present invention for the amplifying circuit 402 in FIG. 14 that operates at the 1.9 gigahertz frequency range. This amplifying circuit is identical to the amplifying circuit shown in FIG. 22 with the exception of the voltages VG1, VG2, and VDD supplied to the power amplifier 824. VG1 and VG2 provide the upper and lower rail voltages for the power amplifier 824 and VDD is the power supply voltage. In the interest of brevity, this amplifying circuit will not be discussed.

Alternative embodiments for the determination of the signal strength loss due to the cabling used in the installation of the amplifying circuitry in an automobile exist. Previously described was the use of a set of switches which is set by the person installing the amplifying circuitry. The particular configuration of the switches would let the CPU of the power booster know how much to compensate for the losses (e.g., due to cable length).

Another alternative embodiment would be after the system is powered up and before the normal call process is conducted, the radio transceiver would send a test signal and the transmitted signal strength indicator inside the power booster detects the power. It would then compare the signal strength with the standard value stored inside the unit. From the difference, if any, it determines whether power compensation is necessary or not.

While the embodiments of the present invention which have been disclosed herein are the preferred forms, other embodiments of the present invention will suggest themselves to persons skilled in the art in view of the disclosure. Therefore it will be understood that variations and modifications can be effected within the spirit and scope of the invention and that the scope of the present invention should only be limited by the claims below. Furthermore, the corresponding structures, materials, acts, and equivalents of any means- or step-plus-function elements in the claims below are defined to include any structure, material, or acts for performing the functions in combination with other claimed elements as specifically claimed.

I claim:

1. A power amplifying circuit comprising:

a first means for amplifying, coupled to a first voltage source, for amplifying a radio frequency (RF) signal from a hand held radio transmitter to produce an output RF signal; and a first means for maintaining the magnitude of said output RF signal at a selected one of a first set of levels, wherein said power amplifying circuit is couplable to a second means for amplifying, coupled to a second voltage source, for amplifying said output RF signal to form an amplified output RF signal, and a second means for maintaining said amplified output RF signal at a fixed gain level, said second voltage source providing a voltage having a magnitude greater than the magnitude of the voltage provided by said first voltage source, said power amplifying circuit further comprising:

a means for detecting the presence of said second amplifying means;

a means for adding, upon detection of said second amplifying means, two levels to the first set of levels, the two levels being lower in magnitude than a lowest level in the first set of levels, the first set of levels and the two levels lower in magnitude together defining a second set of levels;

a means for selecting a predetermined one of the second set of levels when said second amplifying means is detected; and a means for applying said fixed gain level, said fixed gain level having a magnitude greater than the magnitude of any level of the first set of levels and the second set of levels, to said second maintaining means.

2. The power amplifying circuit of claim 1, wherein said 2 levels is an 8 dB linear gain.

3. The power amplifying circuit of claim 1, further comprising a means for holding said hand held radio transceiver in a rest mode, wherein said means for detecting is located within said means for holding and detects the presence of said hand held radio transceiver upon said hand held radio transceiver being in said rest mode.

4. The power amplifying circuit of claim 3, wherein said means for holding is connected to said second means for amplifying via a cable.

5. The power amplifying circuit of claim 4, wherein said first amplifying circuit further comprises an adjustment circuit, said adjustment circuit comprising;

at least one memory location located within a CPU, said set of memory locations pre-set with power loss compensation values;

at least one means for selecting between said at least one memory location according to power loss associated with said power amplifying circuitry; and a means for adding said power loss compensation values selected by said means for selecting.

6. The power amplifying circuit of claim 1, wherein said second means for amplifying further comprises a first amplifying circuit and a second amplifying circuit.

7. The power amplifying circuit of claim 6, wherein said first amplifying circuit operates at 800 megahertz and said second amplifying circuit operates at 1.9 gigahertz.

* * * * *